United States Patent [19]

Maruyama et al.

[11] Patent Number: 5,272,763
[45] Date of Patent: Dec. 21, 1993

[54] APPARATUS FOR INSPECTING WIRING PATTERN FORMED ON A BOARD

[75] Inventors: Yuji Maruyama, Tokyo; Atsuharu Yamamoto, Kawasaki; Hidemi Takahashi, Zama; Hidehiko Kawakami, Tokyo, all of Japan

[73] Assignee: Matsushita Electric Industrial Co., Ltd., Osaka, Japan

[21] Appl. No.: 936,324

[22] Filed: Aug. 28, 1992

Related U.S. Application Data

[63] Continuation of Ser. No. 665,969, Mar. 1, 1991, abandoned.

[30] Foreign Application Priority Data

| Mar. 2, 1990 | [JP] | Japan | 2-52128 |
| Mar. 2, 1990 | [JP] | Japan | 2-52130 |
| Jun. 29, 1990 | [JP] | Japan | 2-173448 |
| Jul. 16, 1990 | [JP] | Japan | 2-189083 |
| Nov. 29, 1990 | [JP] | Japan | 2-334009 |

[51] Int. Cl.$^5$ .............................................. G06K 9/00
[52] U.S. Cl. ................................ 382/8; 382/55
[58] Field of Search .............. 382/8, 55, 25, 26, 54

[56] References Cited

U.S. PATENT DOCUMENTS

| 4,692,943 | 8/1987 | Pietzsch et al. | 382/8 |
| 4,853,967 | 8/1989 | Mandeville | 382/8 |
| 4,949,390 | 8/1990 | Iverson et al. | 382/55 |

Primary Examiner—David K. Moore
Attorney, Agent, or Firm—Pollock, Vande Sande & Priddy

[57] ABSTRACT

An inspection apparatus for inspecting a wiring pattern on a printed board by illuminating the printed board with light to photoelectrically convert light reflected from the printed board into an optical grey level image corresponding to the wiring pattern thereon, the grey level image being converted into a bi-level image. The inspection apparatus includes a thinning circuit to perform a thinning process for removing the bi-level image by one picture element from the background side of the wiring pattern, the thinning process being repeatedly performed predetermined times with respect to all of picture elements of the wiring pattern to output the number of repetitions of the thinning process and further to output a skeleton image. Also included is a distance image converter to output a distance conversion image where the number of repetitions is given as a distance value from the background of the wiring pattern. The inspection apparatus compares the distance value of the distance conversion image with one or more thresholds along the skeleton image. This arrangement allows direct detection of the wiring pattern width, thereby permitting the wiring pattern inspection with a simple structure.

2 Claims, 25 Drawing Sheets

FIG. 3B
| d4 | d3 | d2 |
|----|----|----|
| d5 | *  | d1 |
| d6 | d7 | d8 |
FIG. 3C
   
   
   
LUTA (RIGHT)   LUTB (UPPER)   LUTC (LEFT)   LUTD (LOWER)

```
                                        1010101
                                0101010102020202
                              010202020303030303
                            01010101020303040405 05
                          010202020304040404050 50606
                        0101010102020303030303 0303030404
                      010202020304040404030 30303030404 0505
                    01010101020202020303 03030303020202030303 0404 0505
0101010              01020203040404040303030303 020202020303 0404
0202020101           010101020202020303 03030303030303020202030303 0303
0302010101010101     0102020203030303030303030303020202020202 020202020202
040302020201         01020203030303030303020202020202020202020101 0202
040404030302010101   01020202020202020202020202020101010101010101 01010202
050404040403020202   010101010101010101010101010101010101010101 01010101
05050505040404030201 01
05050505050404040403 03020201010101
04040404040404040403 030303020202 01010101
0303030303030303030202 0202020201 0101010101
0202020202020202020101 01010101 010101
01010101010101010101
                       01010101
```

```
01010101010101010101
01020202020202020201
01020303030303030201
01020304040404030201
01020304040404030201
0102030405060605040201
010203040506050504030201
01020304050505050504030201
0102030405050505050504030201
010203040505050505050504030201
0405050505050505050505050504030201
0405050505050505050505050504040201
04040404040505050505050505040403020201
03030303030303030303030303030303030301
02020202020202020202020202020202020203
01010101010101010101010101010101010102
                                    0101
```

END

T-BRANCH

T-BRANCH

TERMINAL

TERMINAL

TERMINAL

| d4 | d3 | d2 |
|---|---|---|
| d5 | d0 | d1 |
| d6 | d7 | d8 |
FIG. 17
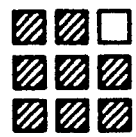
FIG. 18(a)
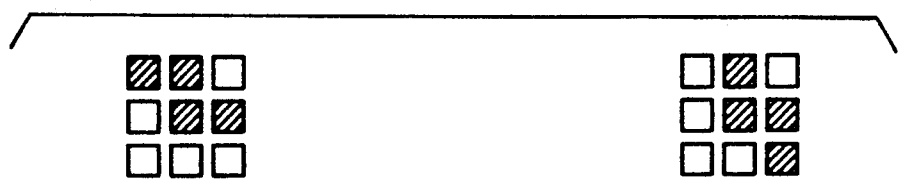
FIG. 18(b)
FIG. 18(c)

*FIG. 21*

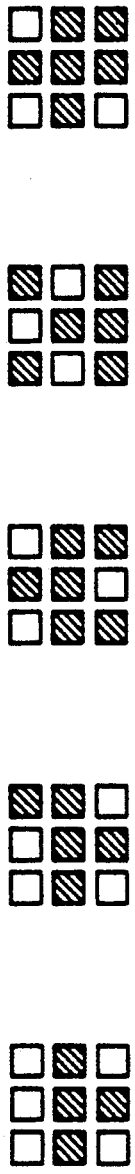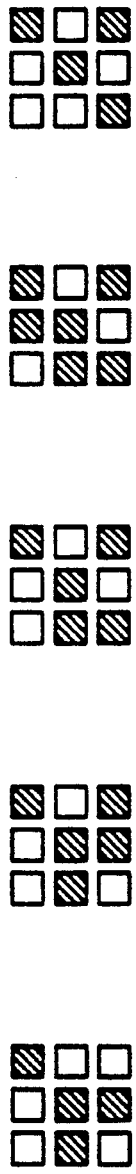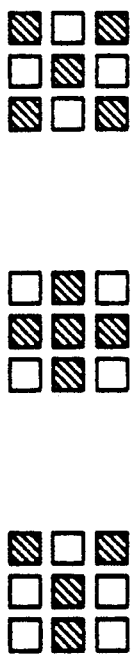

APPARATUS FOR INSPECTING WIRING PATTERN FORMED ON A BOARD

This application is a continuation of Ser. No. 07/665,969 filed on Mar. 1, 1991, now abandoned.

BACKGROUND OF THE INVENTION

The present invention relates to inspection apparatus for a wiring pattern of devices such as a printed board and photomask.

In order to meet the recent requirement for size-reduction and weight-reduction, the precision and complication of a wiring pattern of a printed board or the like increasingly advance whereby difficulty is encountered to keep a high accuracy by a human-made inspection system. Thus, it is strongly desired to automatically and accurately perform the wiring pattern inspection. Various types of wiring pattern inspection systems have been devised hitherto. One known approach is a defect detecting system such as is disclosed in "Machine-Vision Techniques for Inspection of Printed Wiring Boards and Thin-Film Circuits", Optical Society of America, Vol.3, No.3/September, pp1465-1482, 1986, written by Jorge L. C. Sanz and Anil K. Jain. The conventional wiring pattern inspection techniques are generally classified mainly into the so-called design-rule system and comparison system. Of these conventional wiring pattern inspection techniques, there is a promising system arranged to detect defects of a wiring pattern by contracting or expanding bi-level image data to cause a wiring pattern defect before the thinning process, the system being disclosed by Jon R. Mandevile in "Novel Method for Analysis of Printed Circuit Images", IBM J.Res.DEVELOP., Vol.29, No.1, January, 1985. This conventional wiring pattern inspection system will briefly be described hereinbeow with reference to FIG. 1 where (a) to (d) are illustrations for detection of disconnection and (e) to (h) are illustrations of detection of short. In (a) of FIG. 1, let it be assumed that a point a represents a non-defective portion and points b and c respectively designate fatally defective portions accompanying the possibility of light-width abnormality or disconnection. In an operation step 1, a contraction process of the image is effected where the image is scraped or removed by one picture element from the circumference thereof so that the defect appears as disconnections as illustrated in (b) of FIG. 1. An operation step 2 is then performed so as to effect the thinning process where it is further scraped by one picture element from the circumference to become a line-like image as illustrated in (c) of FIG. 1. A subsequent operation step 3 is provided in order to perform scanning with a 3×3 logic mask to detect in accordance with a look-up table (LUT) as illustrated in (d) of FIG. 1. That is, with this process, the portions indicated by the points b and c are detectable to be disconnected. Further, the junction point between a terminal portion and the wiring pattern may be detected at this time.

In (e) of FIG. 1, let it be assumed that points b and c respectively show fatally defective portions accompanying the possibility of the line-separation abnormality and the short. An operation step 1 is first executed so as to effect the expansion process where the image is expanded by one picture element from the circumference thereof so that the portion indicated by the point b enters into a shorted state as illustrated in (f) of FIG. 1. An operation step 2 follows to perform the thinning process to form lines as illustrated in (g) of FIG. 1. A subsequent operation step 3 is further executed so as to perform scanning with a 3×3 logic mask to detect defects in accordance with a look-up table (LUT) as illustrated in (h) of FIG. 1. That is, with this process, the portions indicated by the points b and c are detectable as the short. Here, the image process such as the thinning process and expansion process is known as exemplified by description in textbooks such as "Elements of Image Recognition [1]" published by Ohm Sha.

One of the major problems arising in such a wiring pattern inspection system is, however, that a number of processes including the image-contraction or image-expansion processes and thinning processes are required in the case of setting a plurality of minimum line widths and/or minimum line separations to thereby increase a load to the hardware. In addition, there is a problem in that difficulty is encountered in terms of ensuring accurate discrimination between the wire disconnection and the line-width abnormality and between the line-separation abnormality and the short. Further, according to this technique, difficulty is also encountered to distinguish between the T-branch and the short. Although the discrimination therebetween can be made in advance by learning the coordinate of the T-branch through a desirable printed board with no defect and comparing it with that of a printed board to be detected, this method also provides a problem that it is difficult to perform an accurate positioning between the desirable printed board and the printed board to be inspected. That is, in this case, it is required that the positioning accuracy is within ±0.3 to 0.6 mm.

SUMMARY OF THE INVENTION

It is therefore an object of the present invention to provide a wiring-pattern inspection apparatus which is capable of classifying and detecting various line abnormalities with a simple arrangement.

Another object of this invention is to provide a wiring pattern inspection apparatus which is capable of easily and accurately performing the wiring pattern inspection without requiring complex positioning.

According to this invention, there is provided an inspection apparatus for inspecting a wiring pattern on a printed board by illuminating the printed board with light to photoelectrically convert light reflected from the printed board into an optical gray level image corresponding to the wiring pattern thereon, the grey level image being converted into a bi-level image. The inspection apparatus includes a thinning circuit to perform a thinning process for removing the bi-level image by one picture element from the background side of the wiring pattern, the thinning process being repeatedly performed predetermined times with respect to all of the picture elements of the wiring pattern to output the number of repetitions of the thinning process and further to output a skeleton image. Also included is a distance image converter to output a distance conversion image where the number of repetitions is given as a distance value from the background of the wiring pattern. A defect detecting circuit compares the distance value of the distance conversion image with one or more thresholds along the skeleton image. This arrangement allows direct detection of the wiring pattern width, thereby permitting the wiring pattern inspection with a simple structure.

Further, according to this invention, there is provided an inspection apparatus for inspecting a wiring pattern on a printed board by illuminating the printed board with light to photoelectrically convert light reflected from the printed board into an optical grey level image corresponding to the wiring pattern thereon, the grey level image being converted into a bi-level image. The inspection apparatus includes thinning means which performs a thinning process for removing the bi-level image by one picture element from the background side of the wiring pattern, the thinning process being repeatedly performed predetermined times with respect to all of the picture elements of the wiring pattern to output the number of repetitions of the thinning process and further to output a skeleton image. Also included in the inspection apparatus is feature extraction means to scan the skeleton image with a scanning window to extract a feature of the wiring pattern with reference to a predetermined look-up table and to number the extracted feature information. Further included is feature information storing means to store in advance the feature information extracted when previously inspecting a desirable wiring pattern. The inspection apparatus performs the defect inspection through the defect detecting means. That is, the defect detecting means detects a defect of the wiring pattern on the basis of a relative position between the numbered feature information from the feature extraction means and the numbered feature information from said feature information storing means.

Still further, there is provided an inspection apparatus for inspecting a wiring pattern on a printed board by illuminating the printed board with light to photoelectically convert light reflected from the printed board into an optical grey level image corresponding to the wiring pattern thereon, the grey level image being converted into a bi-level image. The inspection apparatus includes thinning means performs a thinning process for removing the bi-level image by one picture element from the background side of the wiring pattern, the line-fining process being repeatedly performed predetermined times with respect to all of the picture elements of the wiring pattern to output the number of repetitions of the thinning process and further to output a skeleton image. Also included in the inspection apparatus is feature extraction means to scan the skeleton image with a scanning window to extract a feature of the wiring pattern with reference to a predetermined look-up table and to number the extracted feature information. Further included therein is feature information storing means to in advance store the feature information extracted when previously inspecting a desirable wiring pattern and further to number the extracted feature information, and still further to add the numbers of one or more predetermined feature points of the wiring pattern as accessory information of the feature information. A defect decision means reads the feature information from the feature extraction means on the basis of the accessory information from the feature information storing means so as to detect a defect of the wiring pattern with reference to the read feature information.

In addition, according to this invention, there is provided a wiring pattern inspection apparatus for inspecting a wiring pattern on a printed board by illuminating the printed board with light to photoelectically convert light reflected from the printed board into an optical grey level image corresponding to the wiring pattern thereon which is in turn converted into a bi-level image. The inspection apparatus includes first to nth thinning means each performing a thinning process for removing the bi-level image by one picture element from the background side of the wiring pattern and first to nth removal position decision means for detecting a four-adjacent edge or eight-adjacent edge of the wiring pattern to designate the four-adjacent edge or eight-adjacent edge as a position of a picture element to be removed by each of the first to nth thinning means.

Also included is first to nth distance label giving means respectively coupled to the first to nth thinning means and the first to nth removal position decision means for giving a distance label to the removal position at the same time of the thinning process for the picture element removal. The inspection apparatus performs the defect inspection of the wiring pattern through defect detecting means. The defect detecting means comprises measurement means for measuring a line width of the wiring pattern with reference to the distance label along a core line of a thinned image to be obtained by the first to nth thinning means, end-portion detecting means for detecting an end portion of the wiring pattern on the basis of the core line of the thinned image and the measurement result of the measurement means, and branch detecting means for detecting a branch of the wiring pattern on the basis of the core line of the thinned image.

Preferably, one of the first to nth removal position decision means changes and designates the position of the picture element to be removed by the thinning process to a position different from the four-connected or eight-adjacent edge.

BRIEF DESCRIPTION OF THE DRAWINGS

The object and features of the present invention will become more readily apparent from the following detailed description of the preferred embodiments taken in conjunction with the accompanying drawings in which:

FIGS. 3B and 3C are illustrations useful for describing the thinning process effected by the FIG. 3A thinning means;

FIG. 17 is an illustration of a picture element arrangement of a 3×3 scanning window;

FIG. 18a-18c shows patterns for describing the changing of the removal position;

FIG. 21 is an illustration of an distance image;

FIG. 23a-23m shows bit patterns for branch detection.

DETAILED DESCRIPTION OF THE INVENTION

Figure 1A:
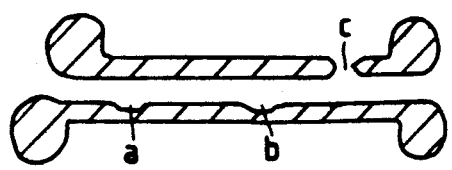
FIG. 1a–1n shows a process to be effected by a conventional wiring pattern inspection apparatus.
Figure 1B:
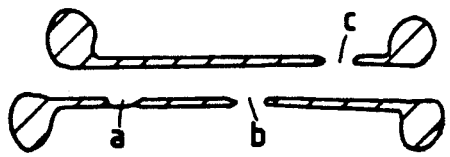
Figure 1C:
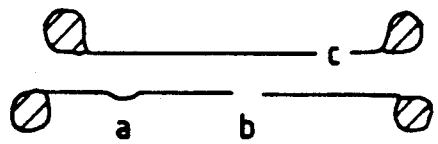
Figure 1D:
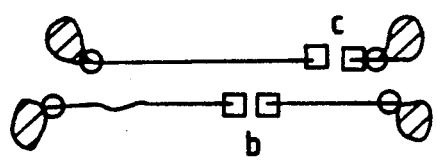
Figure 1E:
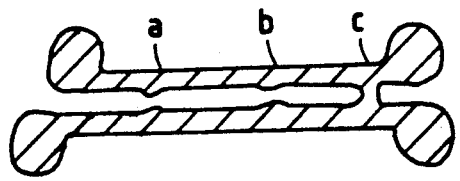
Figure 1F:
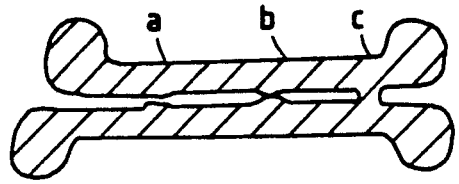
Figure 1G:
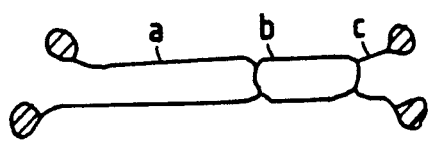
Figure 1H:
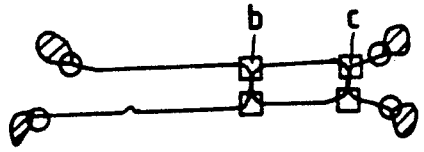
Figure 2:
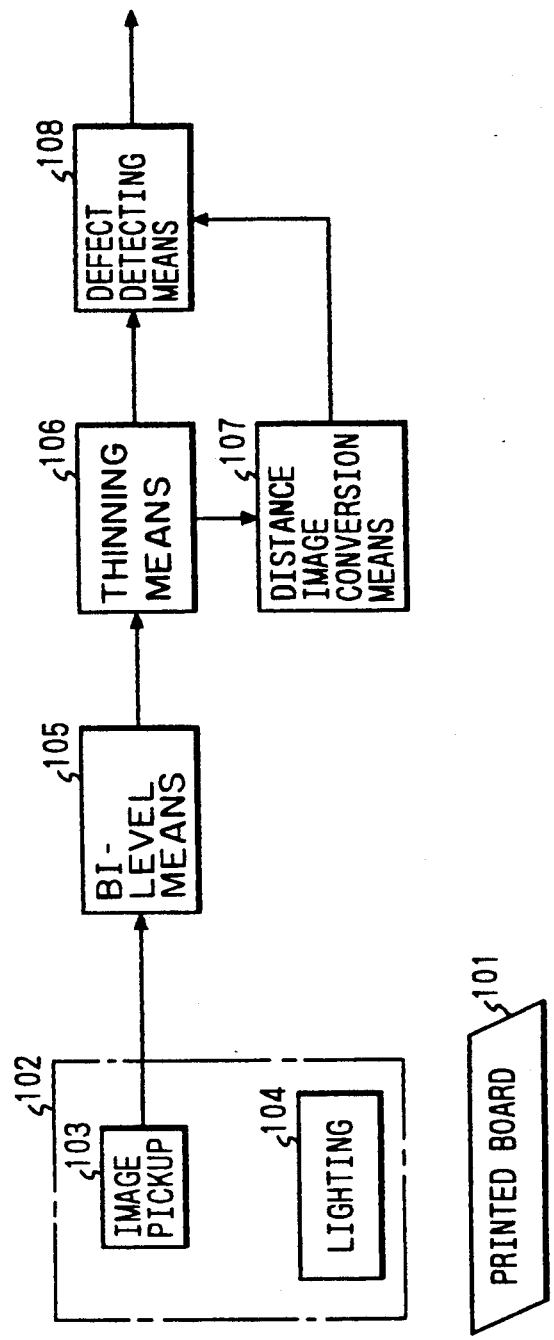
FIG. 2 is a block diagram showing an arrangement of a wiring pattern inspection apparatus according to a first embodiment of this invention.

Referring now to FIG. 2, there is shown an arrangement of a wiring pattern inspection apparatus according to a first embodiment of the present invention. In FIG. 2, illustrated at numeral 101 is a printed board and illustrated at numeral 102 is an image inputting means equipped with a diffusion light device 104 such as a ring-like light guide and an image pickup device 103 for photoelectric-converting the wiring pattern on the printed board 101 into a grey level image. Also included in the wiring pattern inspection apparatus are a bi-level means 105 for converting the variable image into a bi-level image, a thinning processing means 106 for scraping or removing the wiring pattern by one picture element or pixel from the background side on the basis of the bi-level image, and a distance image conversion means 107 coupled to the thinning means 106 for conversion into a distance conversion image, i.e., a minimum distance value, from the background. Further, numeral 108 represents a defect detecting means for comparing a given set threshold with a distance value using the distance conversion image from the distance image conversion means 107 so as to detecting a defect in terms of a wiring pattern width.

Secondly, operation of the FIG. 2 inspection apparatus will be described hereinbelow. With a wiring pattern formed on the printed board 101 being illuminated by means of the diffusion lighting device 104 such as a ring-like light guide, the optical wiring pattern data are inputted as a grey level image through the image inputting means 102 equipped with the image pickup device 103 such as a one-dimensional or two-dimensional CCD camera. In this embodiment, the description thereof will be made using a raster scan image, and therefore a one-dimensional CCD camera is used as the image pickup device 103. In order to separate the grey level image obtained through the image inputting means 102 into the background and the wiring pattern, the bi-level means 105 converts the grey level image into a bi-level image through comparison with a given threshold. The thinning means 106 performs the thinning process times predetermined with respect to all of the picture elements, where the wiring pattern is scraped by one picture element from the background side using the bi-level image from the bi-level means 105 under a predetermined condition, thereby outputting the number of repetitions of the scraped target, or noticeable, picture elements and a skeleton image. The distance image conversion means 107 is responsive to the thinning means 106 so as to output a distance conversion image arranged such that the number of repetitions of the scraped object picture elements is set to be a distance value of the wiring pattern from the background. The defect detecting means 108 is responsive to the skeleton image from the thinning means 106 and the distance conversion image from the distance image conversion means 107 so as to compare the distance value of the distance conversion image with one or more given thresholds (the minimum or maximum value) on the basis of the skeleton image to detect the defect of the wiring pattern width. The above-described operation can be repeatedly successively effected to perform inspection with respect to the entire surface of the printed board 101. The successive operations may be synchronized in accordance with an adequate signal.

Figure 3A:
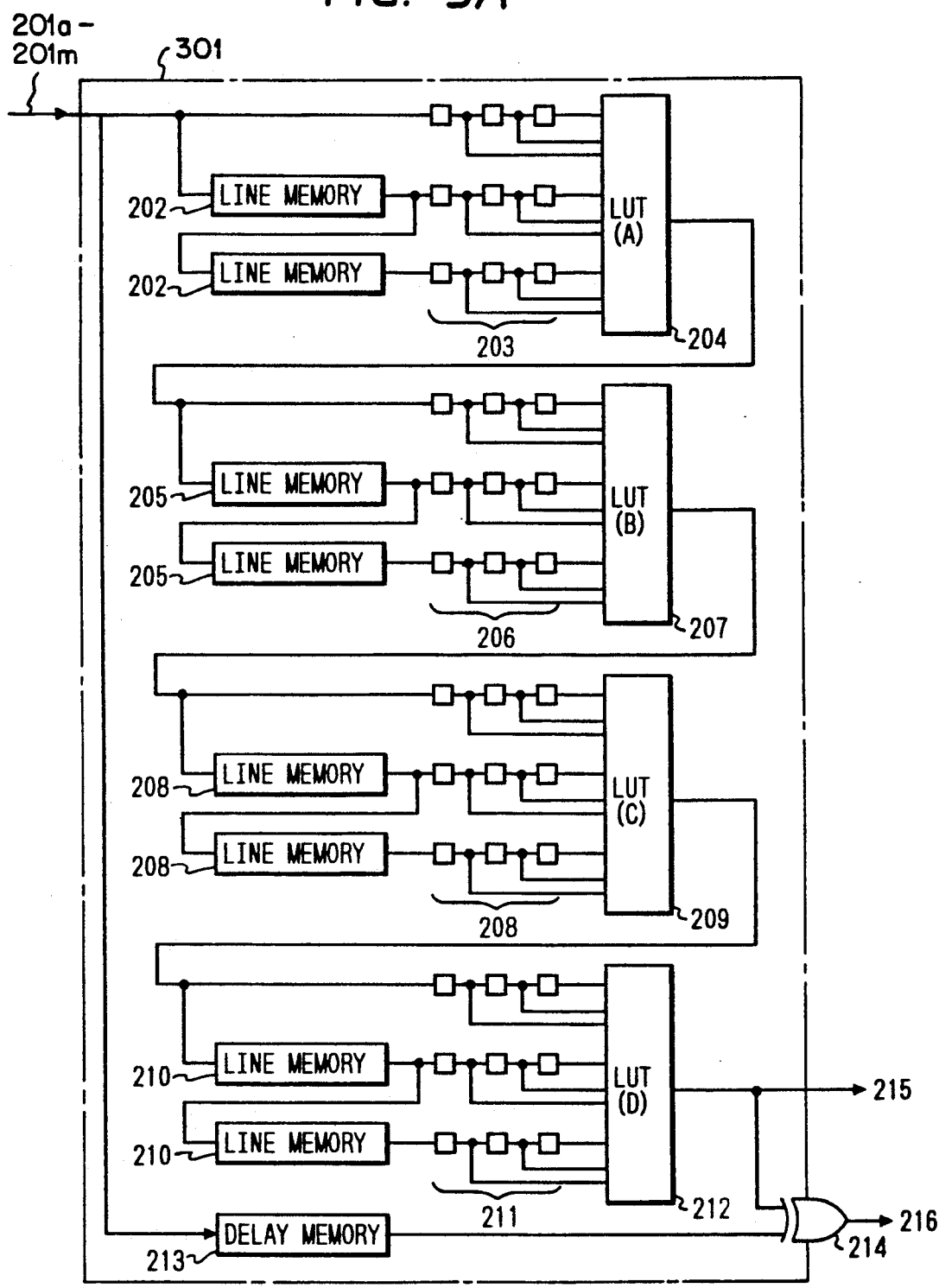
FIG. 3A is a block diagram showing a thinning means to be used in the inspection apparatus of this invention.

Secondly, a detailed description will be made hereinbelow with reference to FIGS. 3A to 3C in terms of the thinning means 106, distance image conversion means 107 and defect detecting means 108. The thinning process is for obtaining a thinned image (skeleton image) by repeatedly performing n times the process in which the wiring pattern is scraped by one picture element from the outside. A general technique for the thinning process will be described with reference to FIGS. 3B and 3C.

As illustrated in FIG. 3B, the bi-level image is scanned with a 3×3 scanning window. When the target picture element (the central picture element of the window indicated by a mark *) is 1, a decision is made on the basis of the states of the surrounding picture elements d1 to d8 in accordance with a LUT (look-up table) as to whether the target picture element changes from 1 to 0 (scraping). The erasure decision of the target picture element is effected with four processes. This is for preventing the erasure of the pattern of the even picture element width and for respectively registering the patterns to be scraped from the upper side, lower side, right side and left side in LUT(A) to LUT(D) as indicated in FIG. 3C.

Returning back to FIG. 3A, a description will be described hereinbelow in terms of the thinning process block 106 performing the thinning process for removal of one picture element. The bi-level image 201 outputted from the bi-level means 105 is inputted to the thinning means comprising four circuit blocks, cascade-connected to each other, which have the similar circuit arrangement including line memories 202, 205, 208 or 210, a 3×3 scanning window 203, 206, 208 or 211 and a look-up table (LUT(A), LUT(B), LUT(C) or LUT(D)) 204, 207, 209 or 212. The inputted bi-level image 201a to 201n is successively transferred to the four circuit blocks in response to an image synchronizing signal (not shown) to be similarly processed four times so as to output a skeleton image 215 to be scraped by one picture element. That is, the bi-level image 201 is first inputted to the line memories 202 for delaying it by one line and further to the 3×3 scanning window 203, the output signals of the line memories 202 being supplied to the 3×3 scanning window 203. The output of the 3×3 scanning window 203 is inputted to the LUT(A) 204 to check the erasure of the target picture element. Thereafter, the similar process is effected in the second to fourth circuit blocks to thereby output the skeleton image 215. With this operation being executed times corresponding to the number of picture elements to be scraped, a desirable thinned image (skeleton image) can finally be obtained therefrom.

Furthermore, the bi-level image 201 is also inputted to a delay memory 213 for causing the bi-level image 201 to be in synchronous relation to the skeleton image 215. The output (skeleton image) 215 of the LUT(D) of the fourth circuit block and the output of the delay memory 213 are respectively supplied to an exclusive "OR" circuit 214 which in turn outputs a flag 216 indicative of the target picture element scraped.

Figure 4:
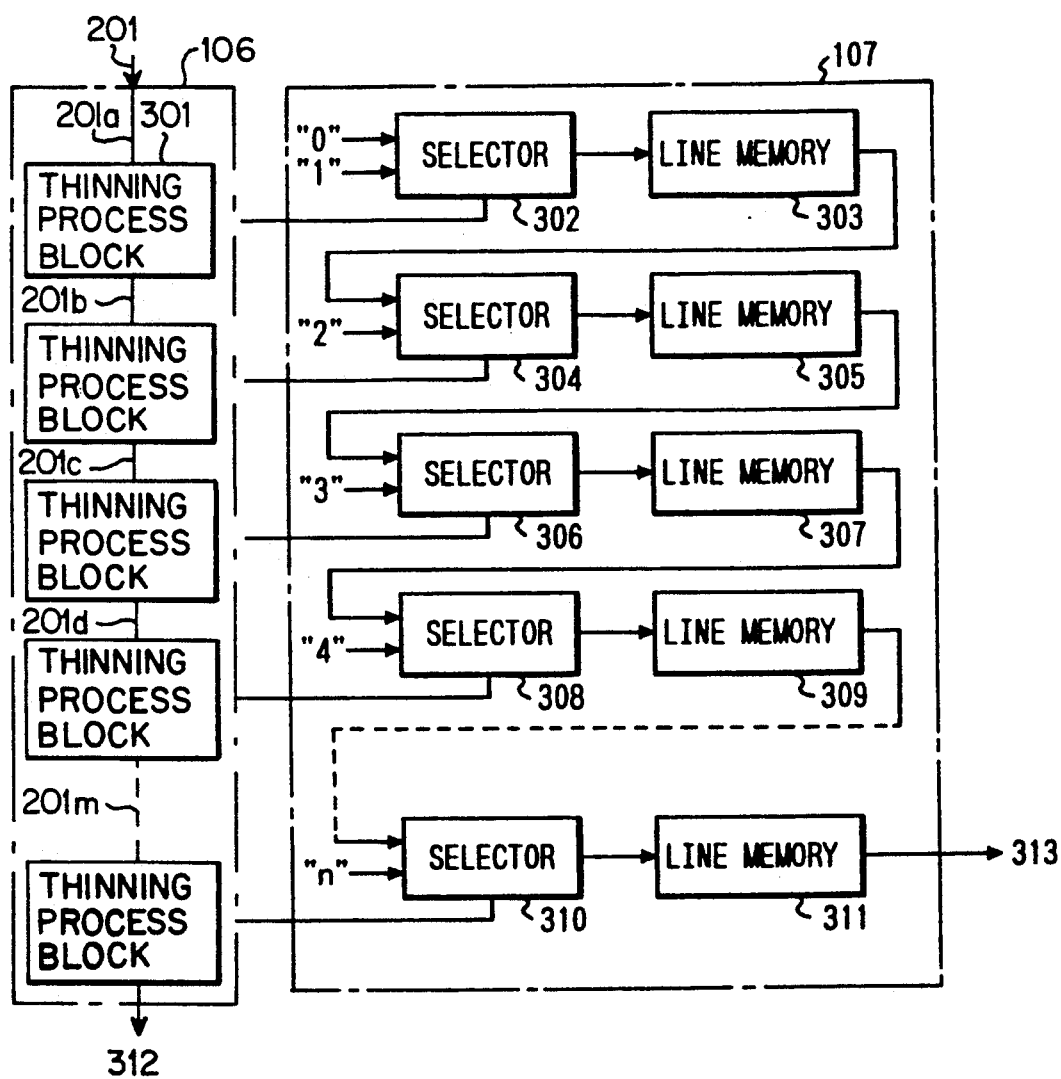
FIG. 4 is a block diagram showing an arrangement of a distance image conversion means to be used in the FIG. 2 inspection apparatus.

A description will further be made hereinbelow in terms of the distance image conversion means 107 with reference to FIG. 4. In FIG. 4, the distance image conversion means 107 is coupled to the thinning means 106 comprising n-stepped one-pixel thinning process blocks 301 each of which has a circuit arrangement as illustrated in FIG. 3A so as to output the flag 216 indicative of the picture element herein scraped. The line fining means 106 outputs a skeleton image 312 at the final stage (the nth thinning process block 301) and each of the respective thinning process blocks 301 outputs the flag 216 which is coupled to the distance image conversion means 107. The distance image conversion means 107 is equipped with selectors 302, 304, 306, 308 and 310 respectively corresponding to the thinning process blocks 301 of the thinning means 106 and multivalue line memories 303, 305, 307, 309 and 311 each coupled to each of the selectors 302, 304, 306, 308 and 310, thereby finally outputting a distance conversion image 313. First, in response to the flag 216 from the first thinning process block 301, the selector 302 selects one of the distance values "0" and "1" which selected one is stored in the line memory 303. Namely, when the flag 216 is "1", it selects the distance value "1". Further, in response to the flag 216 from the second thinning process block 301, the selector 304 selects one of the data from the line memory 303 and a distance value "2", the selected one being combined with the result of the previous process. Such a process is repeatedly effected at the following stages so as to finally obtain the distance conversion image 313, i.e., the final combination result of the distance values at the final stage.

Figure 5:
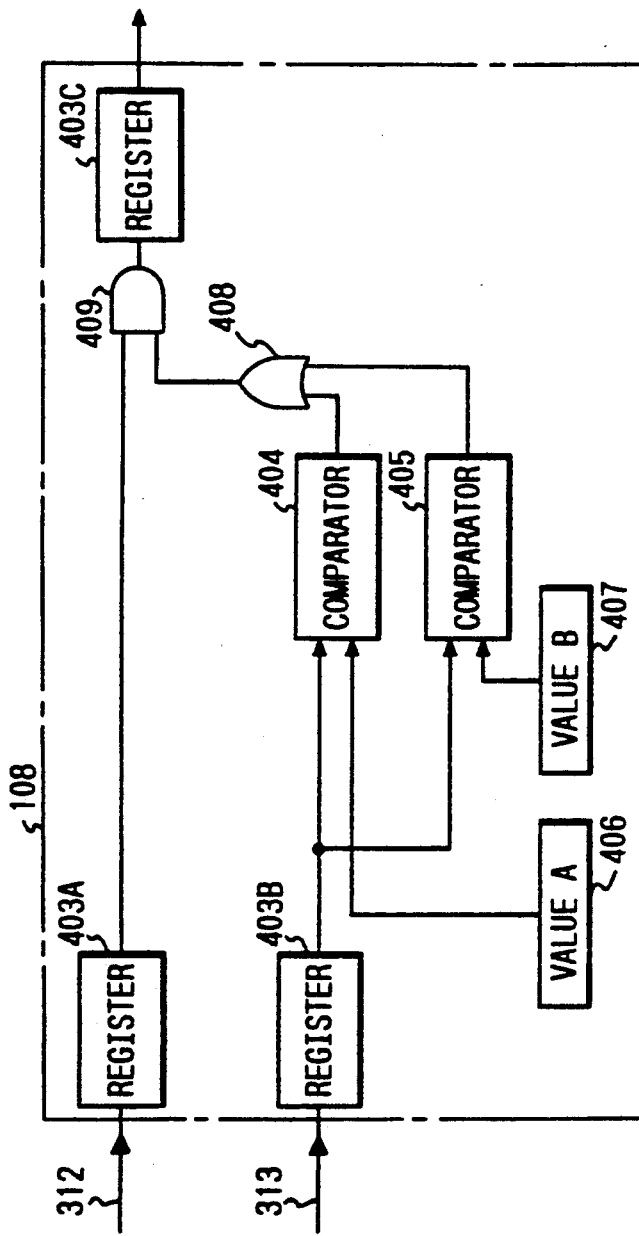
FIG. 5 is a block diagram showing an arrangement of a defect detecting means to be used in the FIG. 2 inspection apparatus.

Still further, a description will be made hereinbelow with reference to FIG. 5 in terms of the defect detecting means 108. In FIG. 5, the defect detecting means 108 is responsive to the skeleton image 312 from the thinning means 106 and further to the distance conversion image 313 from the distance image conversion means 107. That is, the skeleton image 312 is inputted thereto through a register 403A and the distance conversion image 313 is inputted thereto through another register 403B, whereby the skeleton image 312 and the distance conversion image 313 are in synchronizing relation to each other. Thereafter, the skeleton image 312 is directly supplied to an AND circuit 409, while the distance conversion image 313 is once supplied to comparators 404 and 405 which are in turn coupled to set-value generating circuits 406 and 407, respectively, to be responsive to two set values A and B, i.e., two given thresholds (minimum value and maximum value). Here, this embodiment is described with the case that the thresholds to be compared with the distance conversion image 313 are two. The two set values A and B are respectively indicative of the allowable values of the wiring pattern width. The distance conversion image 313 is not only compared with the first set value A in the comparator 404 but also compared with the second set value B in the comparator 405, the comparison results being supplied to an OR circuit 408 to take the logical sum thereof so as to detect the defect of the wiring pattern. Further, the output of the OR circuit 408 is supplied to the AND circuit 409 to take the logical product with respect to the skeleton image 312, where only the defect occurring on the skeleton image 312 is outputted as defect information through a register 403C. Here, it is easily possible to output coordinate data, the type of the defect and others as the defect information. In addition, it is possible to detect the defects of end portions, T-branched portions and others by scanning the skeleton image with a 3×3 scanning window and using a look-up table (LUT).

Figure 6A:
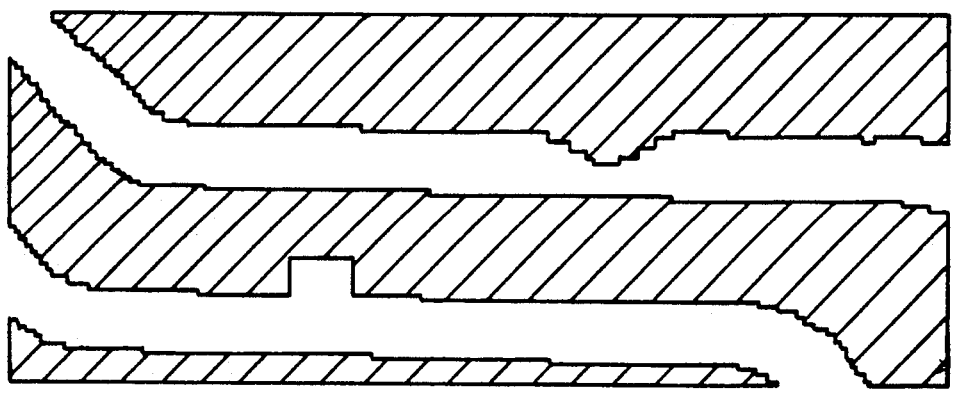
FIGS. 6A to 6D are illustrations for describing the inspection process to be performed the FIG. 2 inspection apparatus.
Figure 6B:
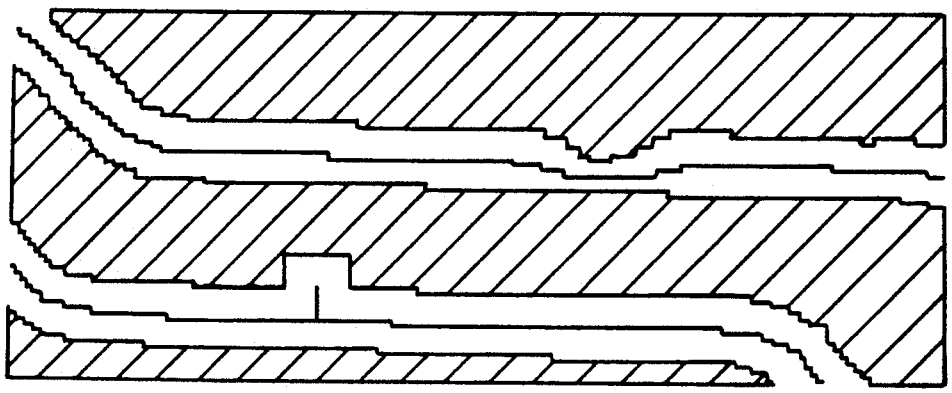
Figures 6C, 6D:
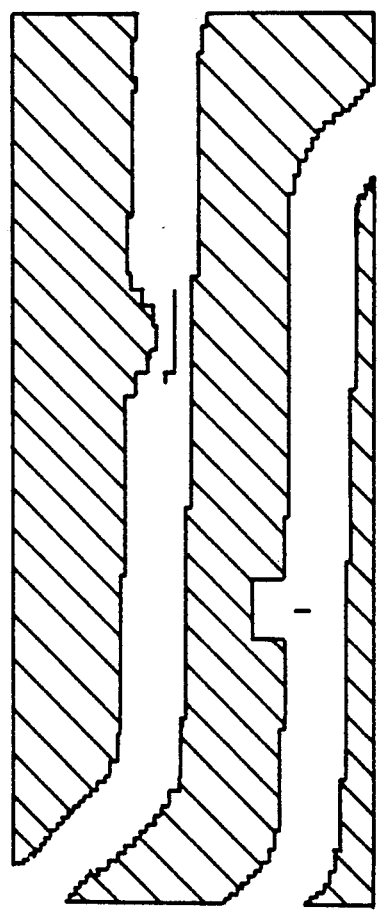

FIGS. 6A to 6D are illustrations of the wiring pattern inspection process to be made by the embodiment of this invention. FIG. 6A shows a bi-level image containing line-width abnormalities in a wiring pattern, FIG. 6B shows a bi-level image and a skeleton image thinned, FIG. 6C shows a distance conversion image converted, and FIG. 6D shows defects found by the detect detecting process. Here, the defect detection is made when the minimum line width is below 7 picture elements and maximum line width is above 13 picture elements.

According to this embodiment, for detection of a defect of a wiring pattern the thinning process for scraping the wiring pattern by one picture element from the background side using a bi-level image is repeatedly effected n times so as to obtain a skeleton image and a distance conversion image is obtained by providing a distance value from the background side to the target picture element scraped, and therefore the skeleton image and the distance conversion image can simultaneously be obtained to easily set a plurality of line-width allowable thresholds, thereby allowing detection of various line abnormalities.

Figure 7:
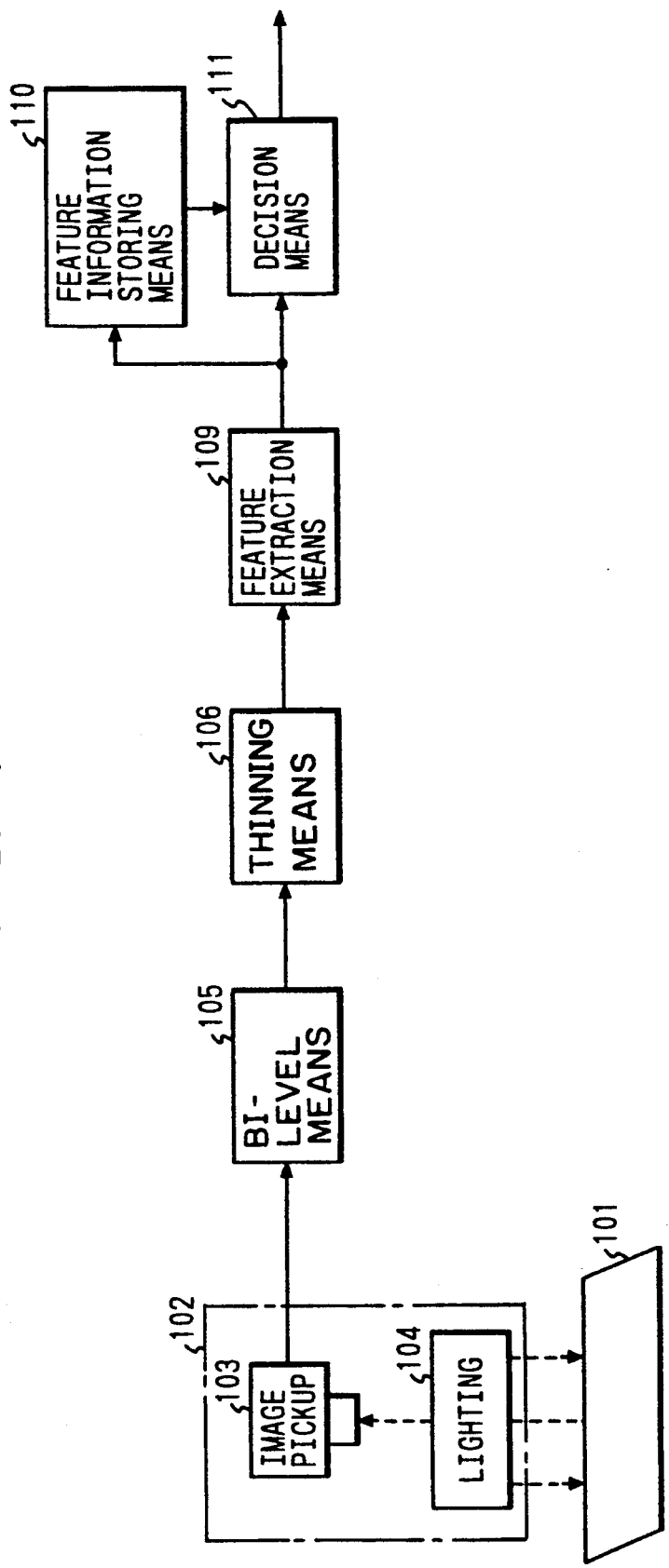
FIG. 7 is a block diagram showing an arrangement of a wiring pattern inspection apparatus according to a second embodiment of this invention.

A second embodiment of this invention will be described hereinbelow with reference to FIG. 7 in which parts corresponding to those in FIG. 2 are marked with the same numeral and characters. In FIG. 7, illustrated at numeral 101 is a printed board having thereon a wiring pattern, and illustrated at numeral 102 is an image input means provided with a diffusion lighting device 104 and an image pickup device such as a CCD camera 103 for converting the wiring pattern on the printed board 101 into a grey level image. The image input means 102 is coupled to a bi-level means 105 which converts the grey level image therefrom into a bi-level image, which is in turn, led to a thinning means 106 to perform a thinning process for scraping or removing the picture elements one from the background side using the bi-level image from the bi-level means 105. Illustrated at numeral 109 is a feature extraction means which is responsive to the output image (skeleton image) of the previous-step thinning means 106 so as to extract the feature of the wiring pattern of the printed board 101 on the basis of the skeleton image therefrom and further to perform a numbering process. The output of the feature extraction means 109 is supplied to a feature information storing means 110 when obtaining feature information of a desirable wiring pattern. The output of the feature extraction means 109 is also supplied to a decision means 111. The feature information storing means 110 is provided in order to store feature information (learning data) relating to a desirable wiring pattern, and the decision means 111 for deciding a true defect on the basis of the feature information extracted by the feature extraction means 109 and the learning data supplied from the feature information storing means 110.

Operation of the wiring pattern inspection apparatus illustrated in FIG. 7 will be described hereinbelow. The image input means 102 illuminates the wiring pattern on the printed board 101 with the diffusion lighting device 104 and inputs the reflected optical image as a grey level image with the image pickup device 103. Here, in this embodiment, the description is made using a raster scan image, and therefore a one-dimensional CCD camera is used as the image pickup device 103. The grey level image of the image input means 102 is supplied to the bi-level means 105 so as to separate the grey level image into a portion corresponding to the wiring pattern and the background. That is, the bi-level means 105 compares the grey level image therefrom with a given threshold to convert it into a bi-level image. The thinning means 106 performs, n times, the thinning process for scraping the picture elements (the wiring pattern) by one from the background side using the bi-level image from the bi-level means 105 so as to output a thinned image (skeleton image). Further, the feature extraction means 109 scans the skeleton image from the thinning means 106 with nxm scanning window so as to extract the feature information relating to end portions, T-branched portions, terminals and the like in the wiring pattern on the basis of the states of 8 picture elements surrounding a target picture element. The feature extraction means 109 also numbers (labels) the extracted feature information. The feature information storing means 110 is responsive to the output of the feature extraction means 109 so as to store the numbered feature information of the wiring pattern (a desirable wiring pattern with no defect) to be read when performing an inspection of a new wiring pattern. The decision means 111 decides true defects of the wiring pattern on the basis of the relative positions between the numbered feature information of the portions such as end portions, T branched portions and terminals in the wiring pattern which is supplied from the feature extraction means 109 and the numbered feature information of the wiring pattern (a desirable wiring pattern) which is supplied from the feature information storing means 110. The above-described operation can repeatedly be performed to inspect the entire surface of the printed board 101. Those successive operations may be effected in synchronism with an adequate signal.

Figure 8A:
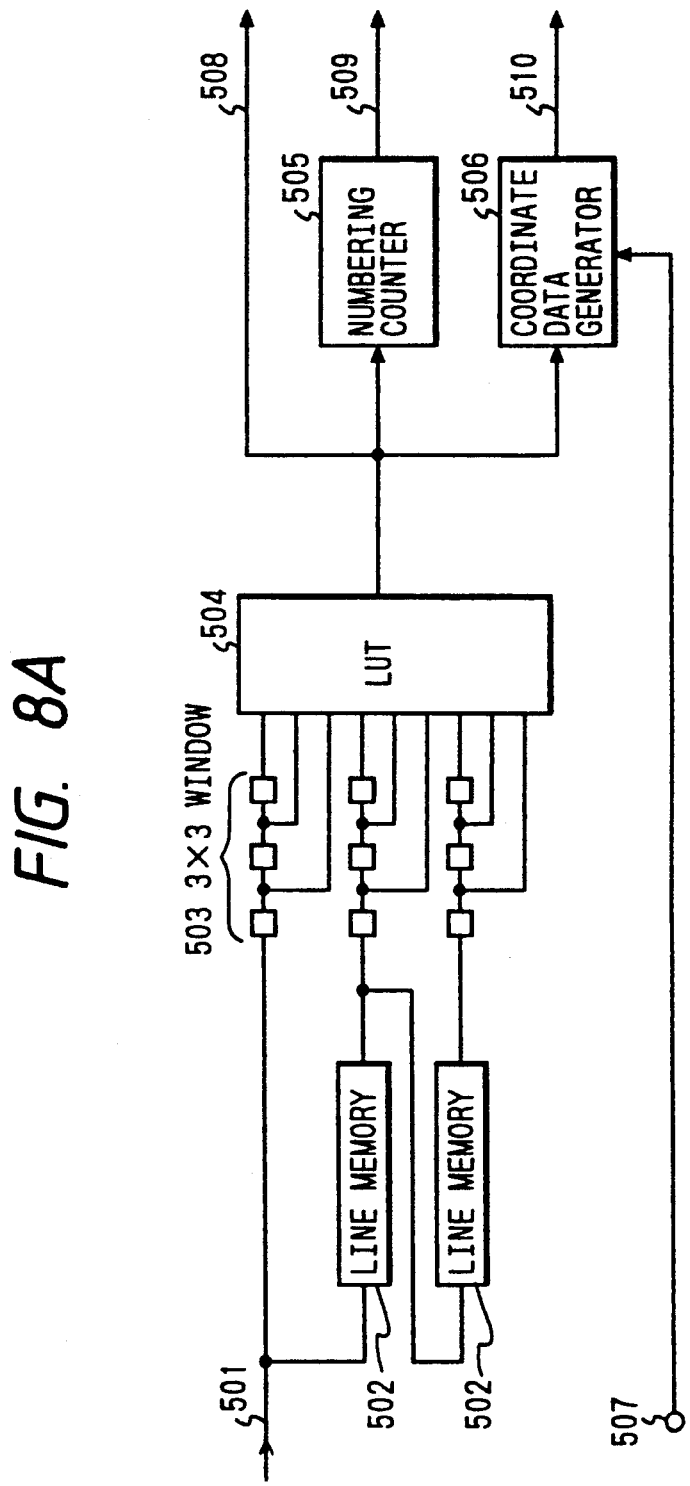
FIG. 8A is a block diagram showing an arrangement of a feature extraction means to be used in the FIG. 7 inspection apparatus.
Figure 8B:
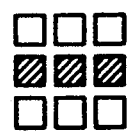
FIG. 8B shows patterns for describing the process made by the FIG. 8A feature extraction means.
Figure 8B:
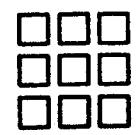
Figure 8B:
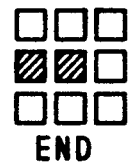
Figure 8B:
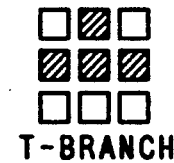
Figure 8B:
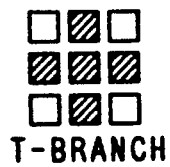
Figure 8B:
Figure 8B:
Figure 8B:

A description will hereinbelow be made in detail in terms of the feature extraction means 109, the feature information storing means 110 and the decision means 111. A description of the thinning means 106 will be omitted because of being made in the above-described first embodiment. First, the feature extraction means 109 will be described with reference to FIG. 8A. In FIG. 8A, the feature extraction means 109 is for detecting the features of the end portions, T-branched portions and terminals in the wiring pattern by using the skeleton image inputted as illustrated at numeral 501. That is, the skeleton image 501 is scanned with a 3×3 scanning window 503 so as to detect the features on the basis of the states of 8 picture elements surrounding a target picture element. In this embodiment, the description is made in terms of the case of using with a scanning window of 3×3. The skeleton image 501 inputted from the thinning means 106 is supplied to line memories 502 and further to the 3×3 scanning window 503. The 3×3 scanning window 503 is coupled to a LUT (look up table) 504 to check the states of the target picture element and the surrounding 8 picture elements outputted therefrom and to output a signal 508 indicative of the type or kind of the feature detected. The LUT 504 is composed of reference tables such as illustrated by (a) to (h) in FIG. 8B to thereby distinguish the end portion, T-branched portion, terminal and others in the wiring pattern. Further, on the extraction of the feature, a numbering counter 505 gives a label number 309 to the target picture element in order of generation, for example. A coordinate data generator 506 is responsive to a synchronizing signal 507 (for example) so as to output coordinate data 510 of the target picture element.

Figure 9:
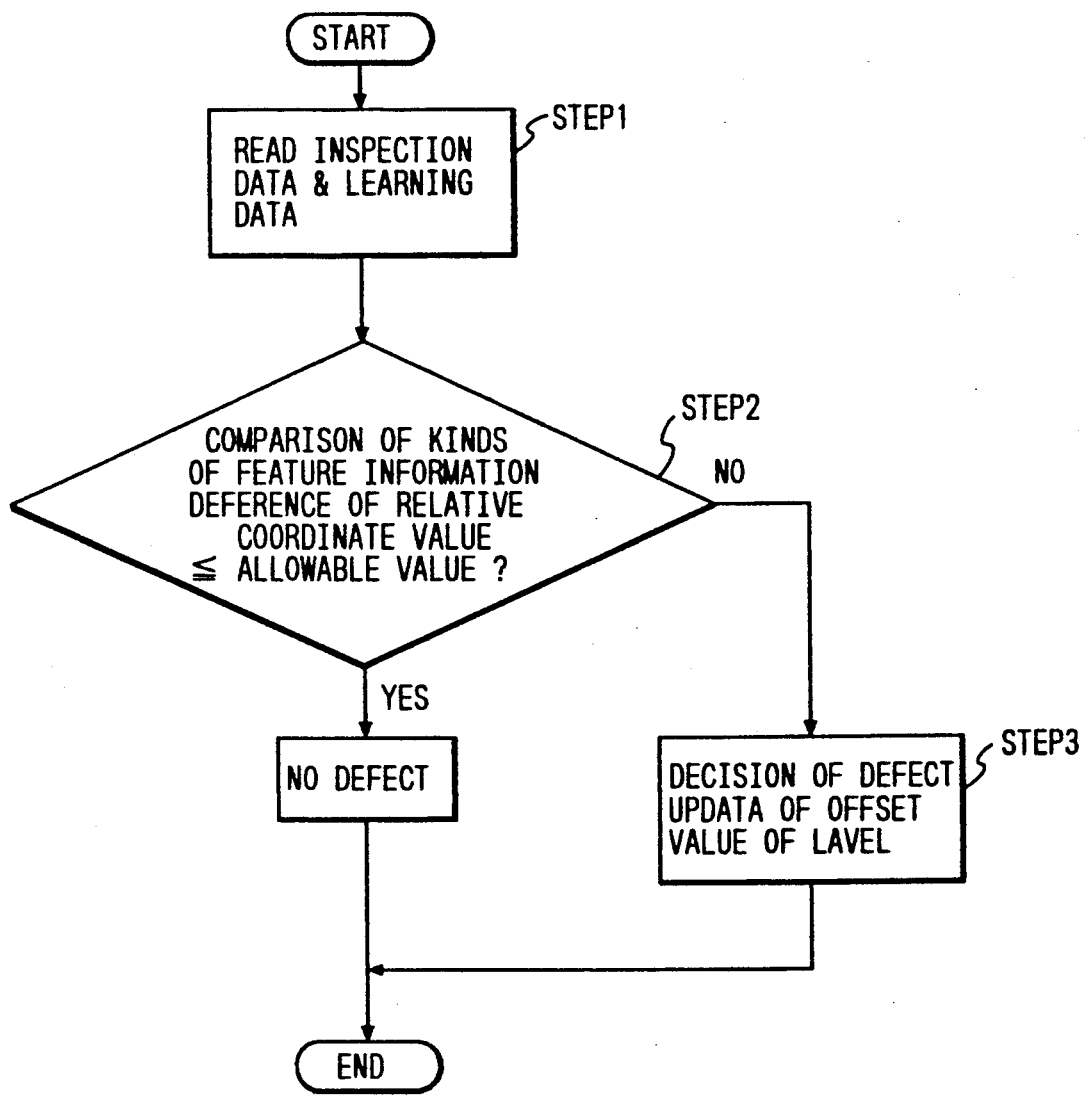
FIG. 9 is a flow chart showing an operation to be executed by the FIG. 7 inspection apparatus.
Figure 10A:
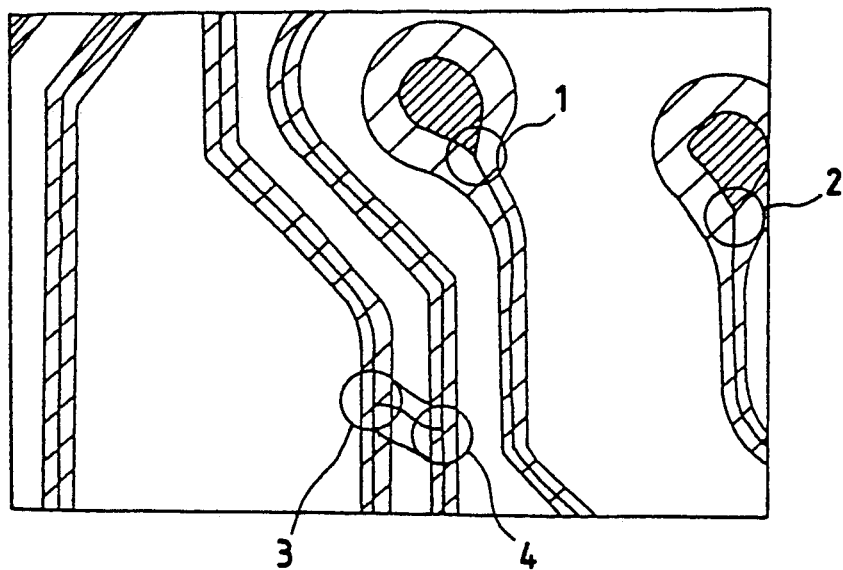
FIGS. 10A and 10B are illustrations useful for describing the process of the FIG. 7 inspection apparatus.
Figure 10B:
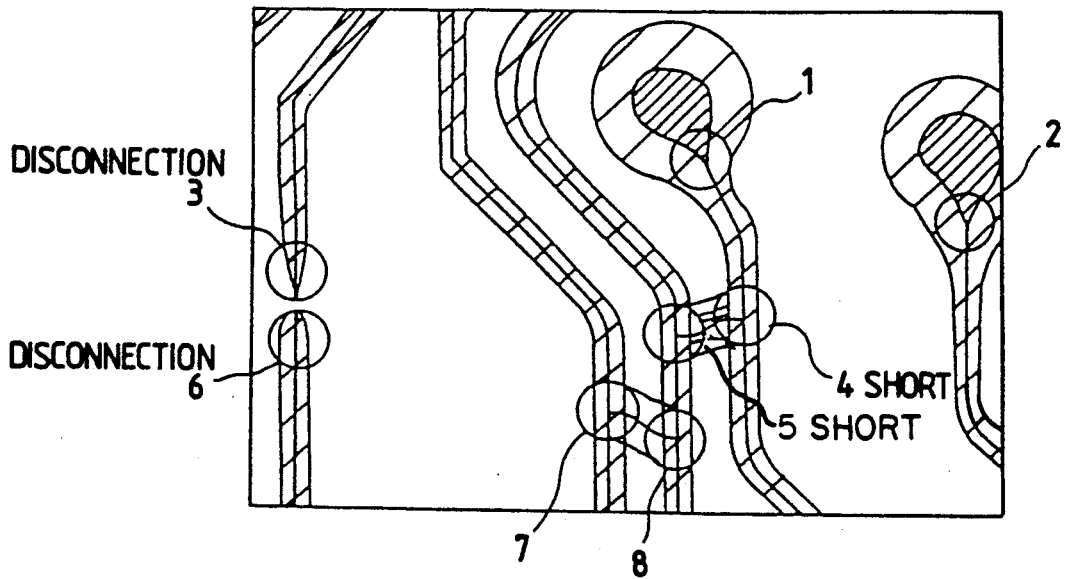

FIG. 9 is a flow chart showing a decision operation to be executed by the decision means 111. The following first and second tables respectively show the feature information supplied from the feature information storing means 110 and the feature information extracted by the feature extraction means 109. FIGS. 10A and 10B show the feature information and examples of the defect detection.

TABLE 1

| Feature Extraction of Desirable Wiring Pattern | | |
|---|---|---|
| Label Number | Kind | Coordinate |
| 1 | terminal | |
| 2 | terminal | |
| 3 | T-branch | |
| 4 | T-branch | |
| . | | |
| . | | |
| . | | |

TABLE 2

| Feature Extraction of Wiring Pattern to be Inspect | | | | |
|---|---|---|---|---|
| Label Number | True Label Number | Kind | Coordinate | Decision |
| 1 | 1 | terminal | | good |
| 2 | 2 | terminal | | good |
| 3 | 2 | end | | bad (disconnected) |
| 4 | 2 | T-branch | | bad (shorted) |
| 5 | 2 | T-branch | | bad (shorted) |
| 6 | 2 | end | | bad (disconnected) |
| 7 | 3 | T-branch | | good |
| 8 | 4 | T-branch | | good |
| . | | | | |
| . | | | | |
| . | | | | |
| n | n | | | |

The decision means 111 decides the true defect in accordance with the flow chart as illustrated in FIG. 9. This decision operation starts with a step 1 to read, simultaneously with the feature information (inspection data) of the wiring pattern to be inspected to which a label number given (at the timing of the detection), the feature information (learning data) with the same label number from the feature information storing means 110. A step 2 is provided in order to check whether the kinds of feature information are coincident with each other and further check whether the difference between the relative coordinate of the inspected wiring pattern and the relative coordinate of the desirable wiring pattern is below a given allowable value. If the answer of this step 2 is affirmative, because of the registered feature information, the decision is made such that there is no defect. If negative, the operational flow goes to a step 3. In the step 3, the decision is made such that there is truly defect. In this case, concurrently with notifying this fact, the offset value of the label number is updated. This is for coinciding the label number of the inspected wiring pattern with the label number of the desirable wiring pattern.

Here, the first and second tables show the examples of the formats of the feature information of the feature information storing means 110 and the feature information of the inspected wiring pattern. The feature information of the feature information storing means 110 is feature information relating to end portions, T-branched portions, terminals and others in a desirable wiring pattern and is read when inspecting the other wiring patterns. FIG. 10A shows feature points of a desirable wiring pattern and hence the information shown in the first table is stored in the feature information storing means 110. Further, FIG. 10B shows an inspected wiring pattern with defects. Thus, the feature information shown in the second table is detected by the feature extraction means 109.

According to this embodiment, a skeleton image obtained is scanned with a scanning window (n×m) so as to extract the feature information relating to end portions, T-brached portions, terminals and others, to which label numbers are given in order of generation. Further, learning is in advance executed with a desirable wiring pattern and the learning result is stored in the feature information storing means. For inspection of a wiring pattern, the label-numbered feature information of the wiring pattern to be inspected is checked at positions relative to the label-numbered feature information from the feature information storing means. Thus, it is possible to accurately detect true defects without requiring complex positioning.

Figure 11:
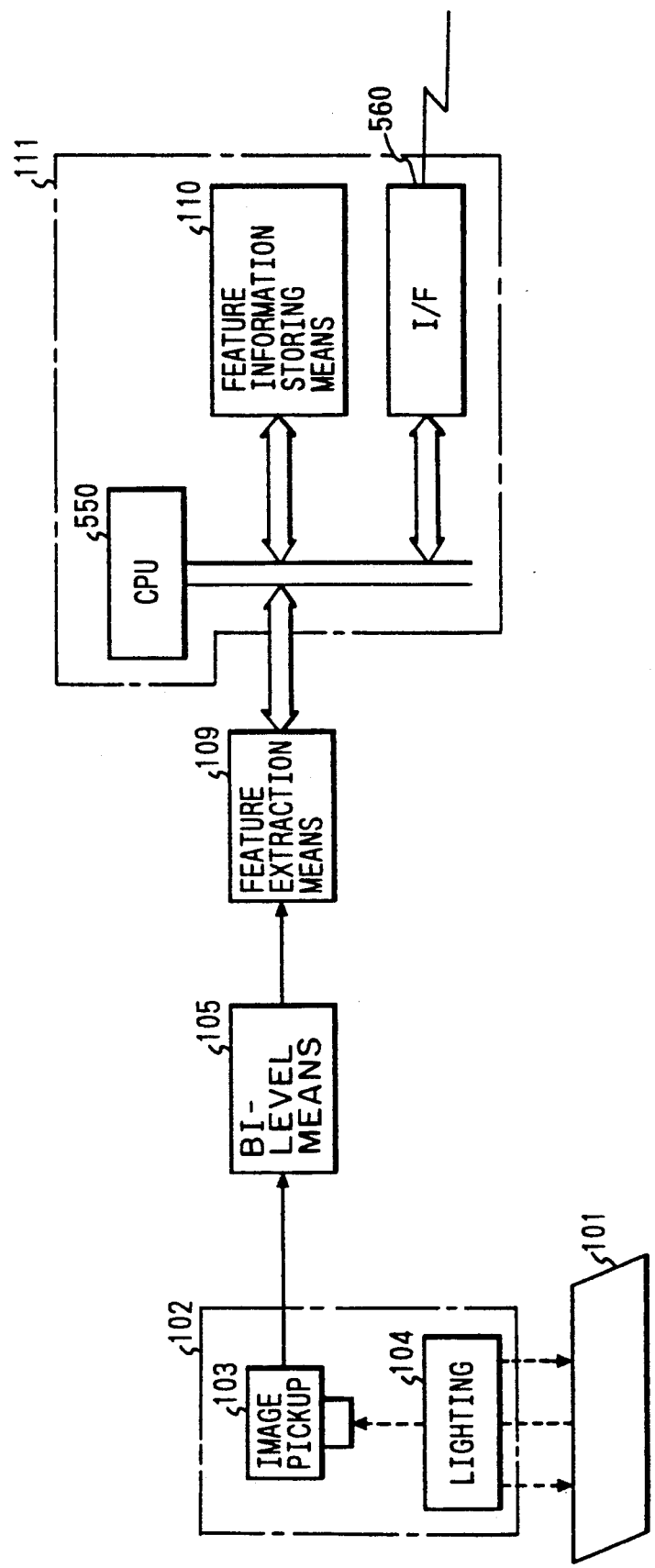
FIG. 11 is a block diagram showing an arrangement of a wiring pattern inspection apparatus according to a third embodiment of this invention.

FIG. 11 illustrates a wiring pattern inspection apparatus according to a third embodiment of this invention. In FIG. 11, illustrated at numeral 101 is a printed board having thereon a wiring pattern, and illustrated at numeral 102 is an image input means provided with a diffusion lighting device 104 and an image pickup device such as a CCD camera 103 for converting the wiring pattern on the printed board 101 into a grey level image. The image input means 102 is coupled to a bi-level means 105 which converts the grey level image therefrom into a bi-level image, which is in turn led to a feature extraction means 109 to perform a thinning process for scraping or removing the picture elements by one from the background side using the bi-level image from the bi-level means 105 and further to extract the feature of the wiring pattern of the printed board 101 from a skeleton image. Numeral 111 represents a decision means for detecting true defects of the wiring pattern to be inspected. The decision means 111 is composed of a feature information storing means 110 for storing feature information of a desirable wiring pattern, a central processing unit (CPU) 550, an I/F (interface) 560 for notification of defects. The I/F 560 is coupled to a confirmation (verify) section, not shown, for confirming the defects by human.

Secondly, operation of the wiring pattern inspection apparatus according to this embodiment will be described hereinbelow. The image inputting means 102 illuminates the wiring pattern on a printed board 101 with the diffusion light device 104 and picks up the reflected light image into a grey level image with the image pickup device 103 (a CCD camera). The grey level image due to the image pickup device 103 is supplied to the bi-level means 105 to compare the grey level image with a predetermined threshold so as to convert it into a bi-level image for separating it into the wiring pattern and the background. Thereafter, the bi-level image is led to the feature extraction means 109 to perform, n times the thinning process to scrape the wiring pattern by one picture element from the background to obtain a skeleton image. The skeleton image is scanned with a n×m scanning window so as to output the feature imformation relating to end portions, T-branched portion, terminals and others on the basis of the states of 8 picture elements surrounding a target picture element. The feature information storing means 110 numbers the feature information of a desirable wiring pattern from the feature extraction means 109 in order of generation and further adds the numbers of one or more feature points in the vicinity thereof thereto as accessory information and stores them. The stored information is read on the basis of the accessory information on inspection of a wiring pattern. The decision means 111 decides, with the CPU 550, the true defects on the basis of the feature information from the feature extraction means 109 and the feature information of a desirable wiring pattern from the feature information storing means 110. The decision result is outputted through the I/F 560 for notification of the kind of the defect and the coordinate. With this operation repeatedly successively executed, the inspection can be performed with respect to the entire surface of the printed board 101. The successive operations may be effected in synchronism with an adequate signal. The description of the thinning process and the feature extraction process will be omitted because they are substantially similar to those in the above-described embodiments.

Figure 12:
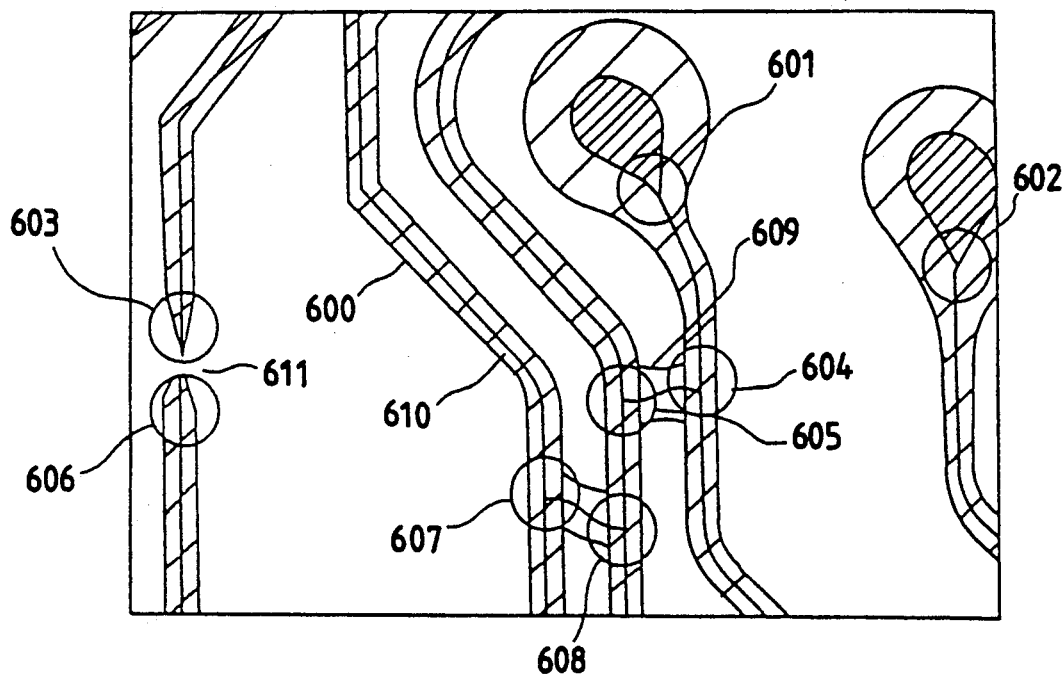
FIG. 12 is an illustration useful for understanding the process performed by the FIG. 11 inspection apparatus.

FIG. 12 shows the examples of the feature points. In FIG. 12, a skeleton image 601 obtained by the thinning process is shown on a wiring pattern 600. The feature points to be extracted are points 601, 602 connected to non-fined portions, T-branched portions 604, 605, 607, 608 and end portions 603, 606. As defect portions of these feature points, there are the T-branch portions 604, 605 (short 609) and the end portions 603, 606 (disconnection 611). On the other hand, the T-branch portions 607, 608 are under design but not defective.

Figure 13A:
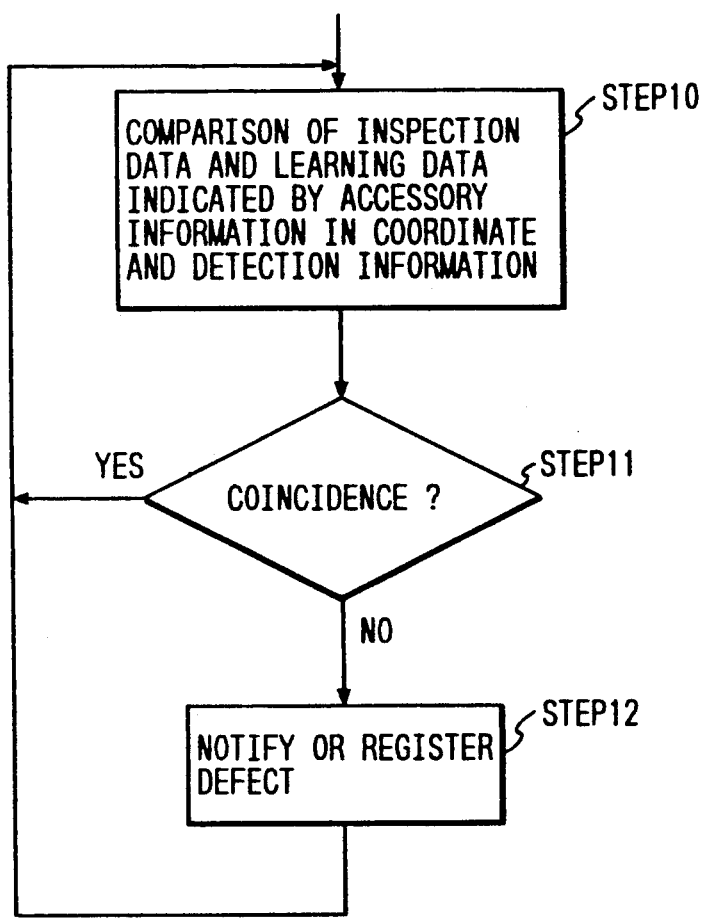
FIG. 13A is a flow chart showing an operation to be executed by the FIG. 11 inspection apparatus.

FIG. 13A is a flow chart showing a decision operation to be executed by the decision means 111. The decision operation starts with a step 10 to compare the inspection data coordinates and feature information with the learning data indicated by the accessory information. A step 11 follows to check whether they are coincident with each other. If the answer of the step 11 is affirmative, the decision is made so as not to be defective. If negative, the notification of defect or registering is made.

Figure 14:
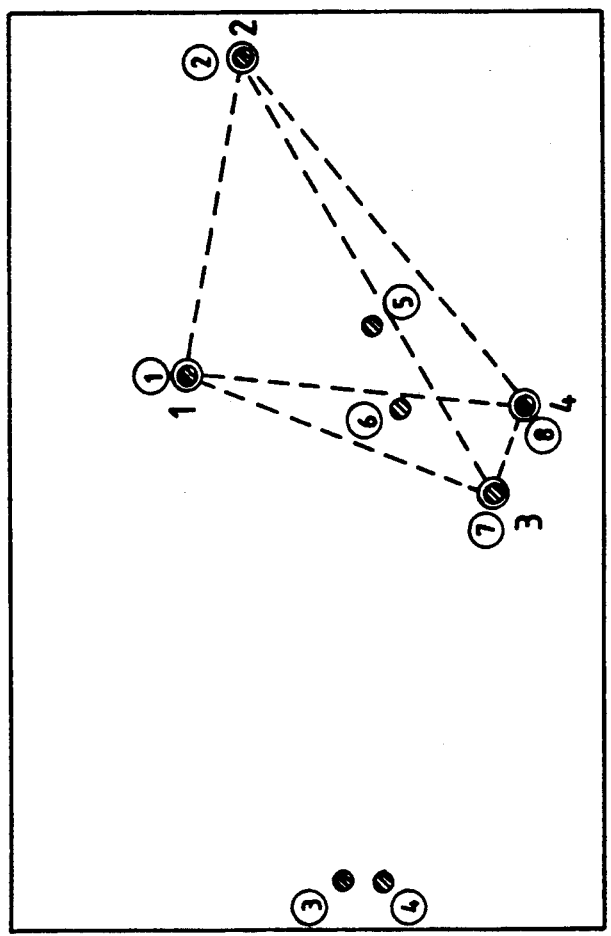
FIG. 14 is an illustration for describing the relation in position between feature points.

The following table 3 and FIG. 14 show the learning data which is the previously obtained feature information of a desirable wiring pattern and the inspection data in connection with FIG. 12. In FIG. 14, numerals 1 to 4 represent registered feature points which are learning data; numerals ①  to ⑧ denote feature points obtained by the inspection, and dotted lines indicate accessory information The following tables 3 and 4 show the learning data and the inspection data where there are numbers, X-Y coordinate, detection information, and accessory information.

TABLE 3

| (Learning Data) | | | |
|---|---|---|---|
| No. | X-Y coordinate | Detection Information | Accessory Information |
| 1 | x1, y1 | connection point | 2, 3 |
| 2 | x2, y2 | connection point | 1, 4, 3 |
| 3 | x7, y7 | T-branch | 4, 1, 2 |
| 4 | x8, y8 | T-branch | 3, 2, E (E: end) |

TABLE 4

| (Inspection Data) | | | |
|---|---|---|---|
| No. | X-Y coordinate | Detection Information | Inspection Result |
| ① | x1, y1 | connection point | good |
| ② | x2, y2 | connection point | good |
| ③ | x3, y3 | end | defect |
| ④ | x4, y4 | end | defect |
| ⑤ | x5, y5 | T-branch | defect |
| ⑥ | x6, y6 | T-branch | defect |
| ⑦ | x7, y7 | T-branch | good |
| ⑧ | x8, y8 | T-branch | good |

The table 3 shows that the accessory information is added to the learning data and the feature points 2 (x2, y2) and 3 (x7, y7) exist in the vicinity of the feature point 1 (x1, y1). The table 4 shows the feature information and inspection result in the inspection data. At the feature point ①, the X-Y coordinate and the detection information are coincident with those in the larning data. Thus, the inspection result becomes "good". Secondly, the feature point 2 or 3 described in the accessory imaformation is detected. The feature point ② detected becomes "good" because of being coincident in X-Y coordinate and detection information with the larning data. Further, the feature point 3 or 4 is detected. The feature point ③ detected is extracted as a defect because of being not coincident in X-Y coordinate and detection information therewith. Similarly, the feature points ④ to ⑥ are compared with the next feature point 3 or 4 and, as a result of the comparison, are extracted as defects because of being not coincident in X-Y coordinate and detection information therewith. On the other hand, the feature points ⑦ and ⑧ respectively become "good" because of being coincident in X-Y coordinate and detection information with the feature points 3 and 4 of the learning data. In addition, character S and E in the accessory information respectively show the start point and the end point. That is, even if the feature point is detectable after the end point, it is considered to be extracted as a defect.

Figure 13B:
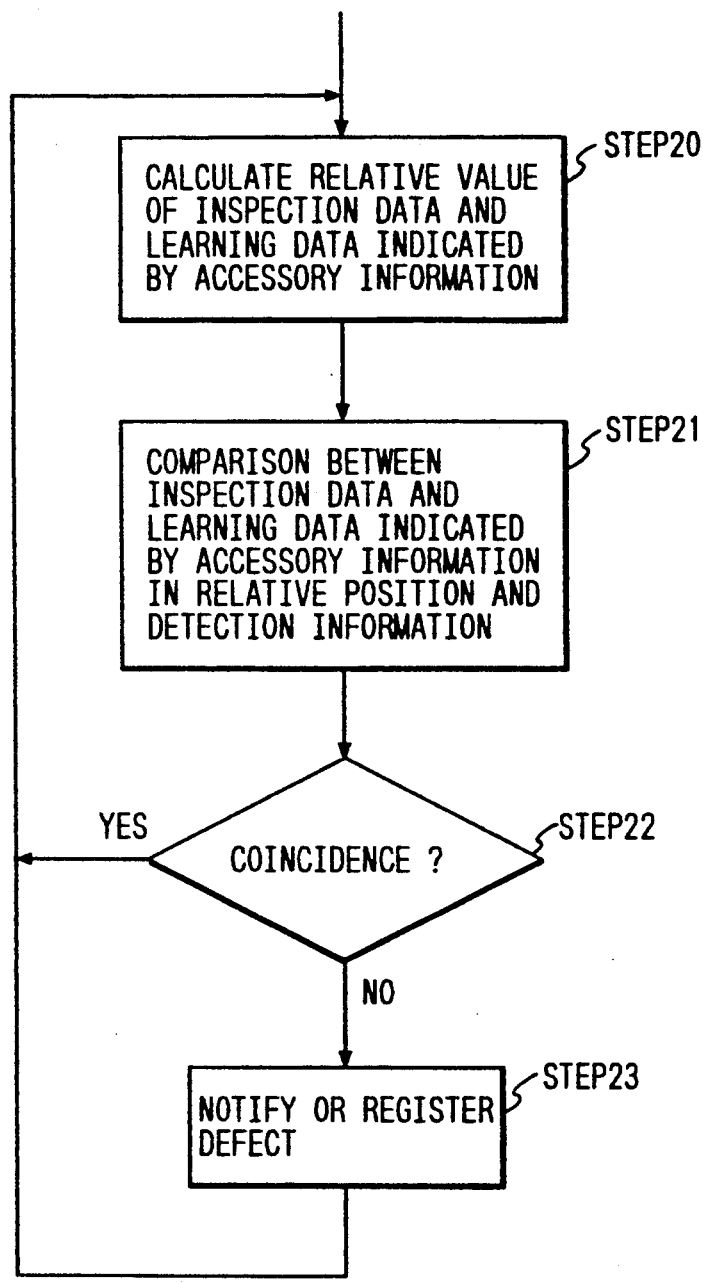
FIG. 13B is a flow chart for describing another operation (fourth embodiment) which can be performed by the FIG. 11 inspection apparatus.

A fourth embodiment (modification of the above-described third embodiment) will be described hereinbelow with reference to FIG. 13B. In a step 20, the relative value coordinates between the inspection data from the feature extraction means 109 and all of the learning data indicated by the accessory information of the previous learning data from the feature information storing means 110 is calculated in accordance with the following equation.

relative value $(\Delta x, \Delta y) = |(x2, y2) - (x1, y1)|$

Thereafter, a subsequent step 21 is executed to compare the inspection data in relative value on coordinate and detection information from the feature extraction means 109 with all of the learning data indicated by the accessory information of the previous learning data from the feature information storing means 110. In a step 22, if they are coincident with each other, a decision is made such that there is no defect because of the feature information registered to the learning data. On the other hand, if not, a step 23 follows to notify or register the defect.

According to the third embodiment, a skeleton image is scanned with a n×m scanning window so as to extract the feature information and numbers them in order of the extraction. Further, the numbers of one or more vicinity feature points are added as the accessory information which are stored in the feature information storing means 110. True defects of the feature information of the inspected printed board are inspected and outputted with reference to the feature information read on the basis of the accessory information. This allows high-speed search of the learning data. Further, according to the fourth embodiment, the feature information of the inspected printed board is compared in relative position with the feature information read out on the basis of the accessory information from the feature information storing means 110, thereby outputting only true defects. This allows high-speed search of the learning data and ease of the positioning of the printed board to be inspected.

Figure 15:
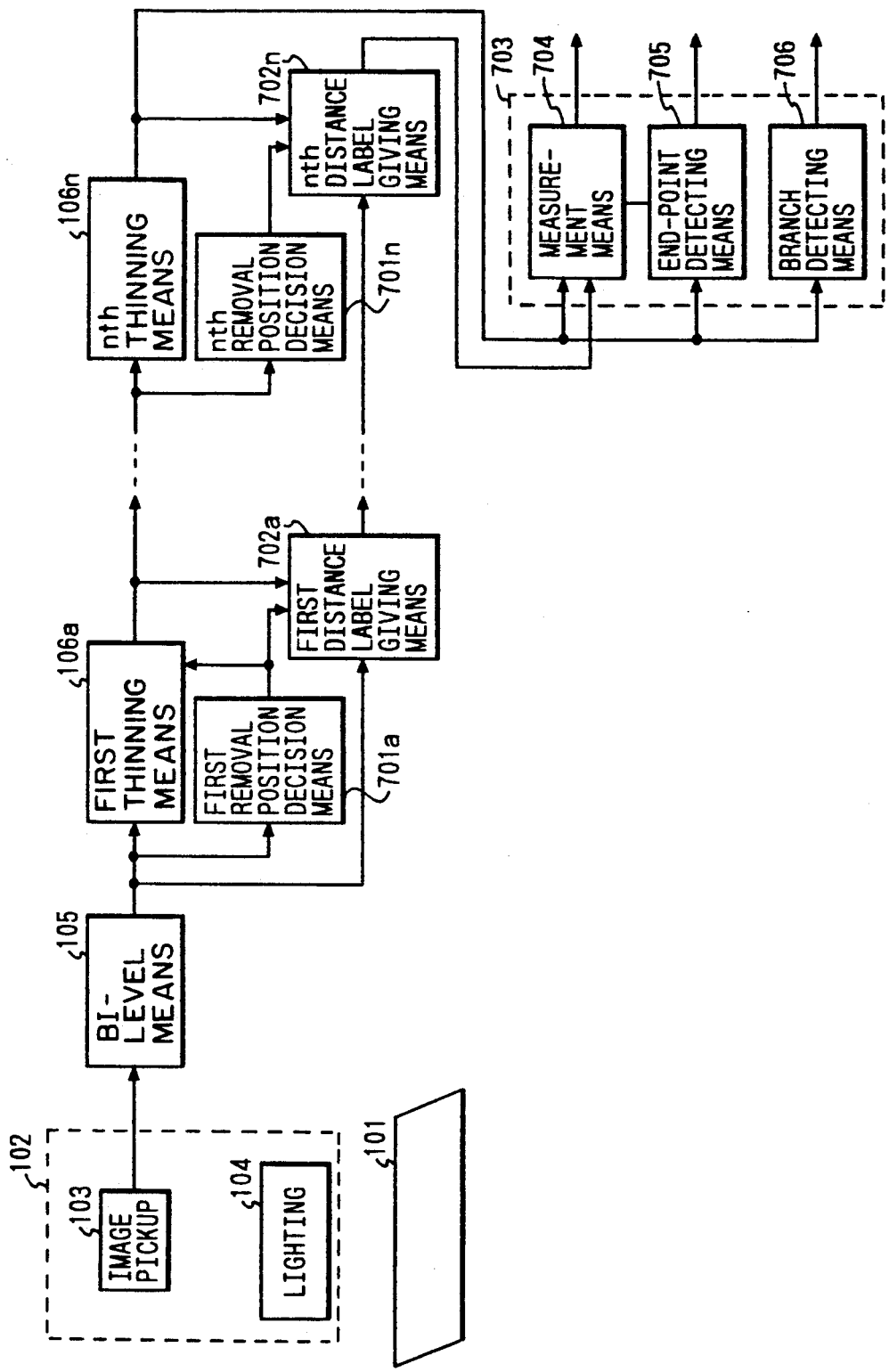
FIG. 15 is a block diagram showing an arrangement of a wiring pattern inspection apparatus according to a fifth embodiment of this invention.

A description will be made hereinbelow with reference to FIG. 15 in terms of a wiring pattern inspection apparatus according to the fifth embodiment of this invention. In FIG. 15, illustrated at numeral 101, is a printed board to be inspected and illustrated at numeral 103 is an image inputting means comprising a diffusion light means 104 for illuminating the printed board 101 and an image pickup device 103 for converting the optical image corresponding to a wiring pattern on the printed board 101 into a grey level image. The variable image is converted in a bi-level means 105 into a bi-level image which is in turn led to first to nth thinning means 106a to 106n for removing the picture elements of the bi-level image by one. References 701a to 701n represent first to nth removal position decision means for detecting the removal positions of the picture elements removed by the first to nth thinning means 106a to 106n, and references 702a to 702n denote first to nth distance label giving means for detecting whether the picture element decided to be at the removal position is removed by the corresponding thinning process and for giving distance labels to the target picture element positions. The outputs of the nth thinning means 106n and the nth distance label giving means 702n are led to a defect detecting means 703 for detecting the defects of the wiring pattern on the basis of the outputs thereof, i.e., a thinned image and a distance image. The defect detecting means 703 is composed of a measuring means 704 for measuring the line width of the wiring pattern along the core line of the thinned image with reference to the distance label, an end point detecting means 705 for detecting the end point of the wiring pattern on the basis of the core line of the thinned image and the measurement value obtained by the measuring means 704, and a branch detecting means 706 for detecting the branch of the wiring pattern on the basis of the core line of the thinned image.

Operation of the FIG. 15 wiring pattern inspection apparatus thus arranged will be described hereinbelow. A wiring pattern of the printed board 101 is illuminated with the diffusion light device 104 of the image inputting means 102 so as to pick up the reflected light by the image pickup device 103 to obtain a grey level image. The obtained grey level image supplied to the bi-level means 105 which compares the grey level image with a predetermined threshold to convert it into a bi-level image where the wiring pattern is indicated by "1" and the background portion is indicated by "0". The first to nth thinning means 106a to 106n respectively remove the wiring pattern by one from the background side using the supplied bi-level image (conversion from "1" to "0"), thereby repeatedly performing the thinning process n times to obtain a thinned image. At this time, the first to nth removal position decision means 701a to 701n coupled to the bi-level means 105 respectively detect the positions of the picture elements to be removed by the corresponding thinning means 106a to 106n so as to control the positions of the picture elements to be removed by the n-time thinning processes and the order of the removal. The first to nth distance label giving means 702a to 702n, respectively coupled to the first to nth removal position decision means 701a to 701n and further to the output sides of the first to nth thinning means 106a to 106n, respectively detect the decision results of the removal position decision means 701a to 701n and further check whether each of the target picture element is removed in the thinning process of that time so as to give distance labels to the target picture element positions in accordance with a procedure which will be described hereinafter. The defect detecting means 703, comprising the measurement means 704, end-point detecting means 705 and branch detecting means 706, extracts the features relating to defects such as line-width abnormality, disconnection and short. The measurement means 704 measures the line width of the wiring pattern along the core line of the thinned image with reference to the distance image so as to the position at which the line has a line width different from a predetermined line width. The end-point detecting means 705 detects a position of the end of the core line of the thinned image so as to detect the disconnection of the wiring pattern with reference to the measured line width value at the position. Further, the branch detecting means 706 detects the branched position of the core line of the thinned image.

The first to nth removal position decision means 701a to 701n are provided for controlling the characteristic of the distance image to be obtained by the first to nth distance label giving means 702a to 702n. That is, the first to nth distance label giving means 702a to 702n give repeat numbers n of the thinning to the removal positions of the picture elements simultaneously performing the first to nth thinning processes, thereby determining the characteristic of the distance image obtained by the order of the picture element removal due to the thinning processes. For example, in the first to nth removal position decision means 701a to 701n, when a four-adjacent edge position is designated as the removal position of the picture element, the distance image to be obtained is a chess-board distance image, and when an eight-adjacent edge position is designated as the picture element removal position, the distance image to be obtained is a city-block distance image. The first to nth removal position decision means 701a to 701n are for suppressing the error with respect to the Euclidean distance by switching the removal position of the picture element in a predetermined order between the four-connection and eight-connection (the edge-adjacent state) at every repeat of the thinning. Further, of these first to nth removal position decision means 701a to 701n, a specified removal position means performs that the position to be removed is changed and designated to the four-adjacent edge portion or the eight-adjacent edge portion so that the distance value to be obtained is arranged to be the minimal path from the pattern boundary.

Figure 16:
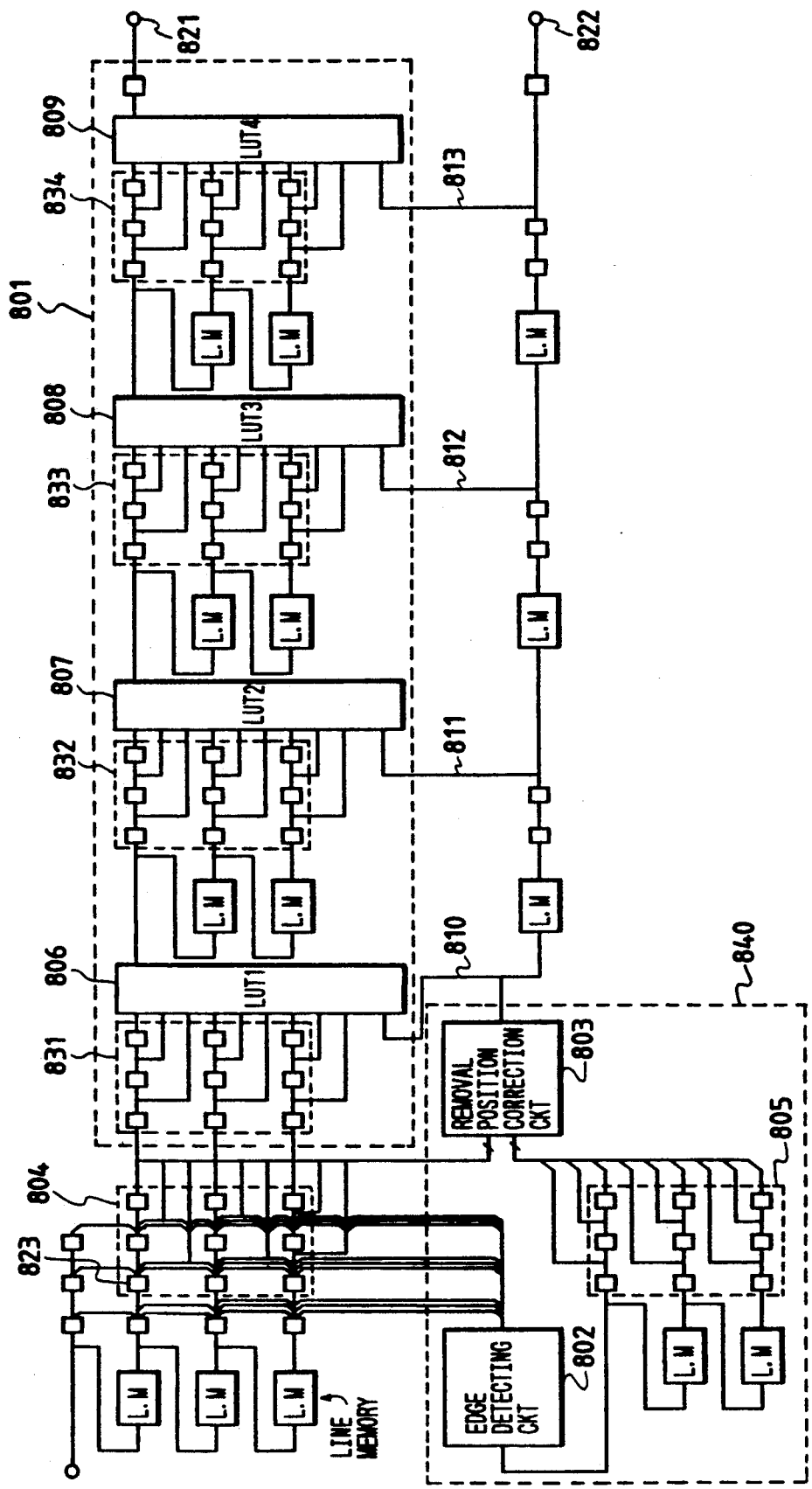
FIG. 16 is a block diagram showing signal processes due to a thinning means and a removal position decision means to be used in the FIG. 15 inspection apparatus.
Figure 19A:
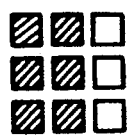
FIG. 19a-19d shows removal patterns in a look-up table.
Figure 19B:
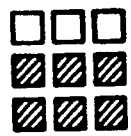
Figure 19C:
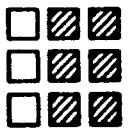
Figure 19D:
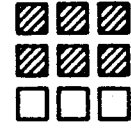

Secondly, a description will be made hereinbelow in terms of the image signal process in the first to nth thinning means 106a to 106n. FIG. 16 is an illustration for describing the image signal process due to one thinning. In FIG. 16, numeral 822 represents an input terminal coupled to the bi-level image from the previous-stage thinning means, 821 desingates an output terminal for outputting the thinned image, 822 depicts an output terminal for outputting the decision signal indicative of the picture element removal position, 801 denotes a thinning circuit, 840 indicates a removal position decision circuit, 802 is an edge detecting circuit, 803 represents a removal position correcting circuit, 831, 832, 833 and 834 respectively designate 3×3 scanning windows for the thinning processes, 804 and 805 respectively depict 3×3 scanning windows for correction decision of the removal position. Illustrated at 806, 807, 808 and 809 are look-up tables LUT1 to LUT 4 for performing the removal decision of the target picture element on the basis of the picture element value of the 3×3 region and the decision signal from the removal position decision circuit 840, illustrated at 823 is the target picture element in the edge detecting circuit 802, and illustrated at 810, 811, 812 and 813 are removal decision signals for controlling the picture elements to be removed in the thinning processes (806 to 809).

The signal process to be effected in FIG. 16 will be described hereinbelow. The inputted image from the terminal 820 is first scanned with the target picture element 823 by means of a 3×3 scanning window comprising 8 registers (chess-board registers) surrounding the target picture element 823, then inputted to the removal position decision circuit 840. In the removal position decision circuit 840, the edge detecting circuit 802 converts the inputted image into an edge image of "1" when the target position is the pattern boundary point and converts it into an edge image of "0" when not being the pattern boundary point.

The operation of the edge detecting circuit 802 will be described hereinbelow with reference to FIG. 17. FIG. 17 is an illustration of an arrangement of data of the 3×3 scanning window. As illustrated in FIG. 17, when the data of the target 233 is taken to be d0 and 8 data surrounding the target picture element 823 data are taken as d1 to d8, the four-adjacent edge and eight-adjacent edge can be converted into edge images in accordance with the following logic.

4-connected edge: $d0 \cdot (\overline{d1 \cdot d2 \cdot d3 \cdot d4 \cdot d5 \cdot d6 \cdot d7 \cdot d8})$ 8-connected edge: $d0 \cdot (\overline{d1 \cdot d3 \cdot d5 \cdot d7})$ where · represents logical product and ⁻ designates negation.

The removal position correcting circuit 803 corrects the position of the picture element to be removed in the thinning process from the four-adjacent edge position or eight-adjacent edge position by using the edge image and the inputted image. Here, a description will first be made in terms of a method of obtaining an octagonal distance image through n-time thinning processes without making the removal decision. In the first to nth removal position decision means 701a to 701n, the removal of the four adjacent edge and the removal of eight-adjacent edges are alternately and repeatedly performed to give the thinning repeat number n to the position of the picture element removal, thereby obtaining an octagonal distance image. Thus, as compared with the city-block distance and chess-board distance, it is possible to reduce the distortion of the distance between the rectangular grating space and the Euclidean space. The octagonal distance takes a relatively accurate value in specified directions (for example, horizontal, vertical and 45° directions), while the distance in a direction therebetween bears an error as compared with the distance defined with the Euclidean space. The removal position correcting circuit 803 is for suppressing this error, where the removal position designated by the four-adjacent edge or eight-adjacent edge is changed in a specified repeat of the first to nth thinning processes. Operation of the removal position correcting circuit 803 will be described hereinbelow with reference to FIG. 16 and 18. In FIG. 16, the edge image, detected by the edge detecting circuit 802, is scanned with the 3×3 scanning window 805. Simultaneously with this scanning, the corresponding position of the inputted image is scanned with the 3×3 scanning window 804. Further, the decision is made with reference to the two 3×3 patterns of the 3×3 scanning windows 804 and 805 as to whether the target position is at the position to be removed. FIG. 18 shows illustrations of a combination of the input image and the edge image in the case that the removal position is changed and designated from the four adjacent edge or eight adjacent edges. In a first example that the position to be removed is changed, when, for the repeat to remove the four adjacent edges, the inputted image has a pattern indicated by (a) in FIG. 18 and the edge image being at the same position has one of the patterns as indicated by (b) in FIG. 18, the target position is not removed, and therefore the target position (central position of the 3×3 window) of the edge image is changed to "0" so as not to be removed. On the other hand, in a second example that the position to be removed is changed, when, for the repeat to remove the eight adjacent edges, the inputted image has the pattern indicated by (a) in FIG. 18 and the edge image being at the same position has one of the patterns indicated by (c) in FIG. 18, since the target position is required to be removed, the target position (the central position of the 3×3 window) of the edge image is changed to "1" so as to be removed. Although the illustration is omitted, similar removal position changing is effected for three rotation symmetry patterns other than the patterns illustrated in FIG. 18.

A detailed example effected in the removal position decision means will be described herein. The following table 5 shows the order of the first to tenth removal position decisions.

TABLE 5

| decision order of removal position | 1 | 2 | 3 | 4 | 5 | 6 | 7 | 8 | 9 | 10 |
|---|---|---|---|---|---|---|---|---|---|---|
| connection of edge to be detected | 4 | 8 | 8 | 4 | 8 | 4 | 8 | 4 | 8 | 8 |
| correction of removal position | x | x | x | x | x | ○ | x | ○ | ○ | x |

In "connection of edge to be detected" of the above-shown table 5, numeral 4 represents the four-adjacent edge and 8 represents the eight-adjacent edge. Further, in "correction of removal position", the circle-mark represents the changing from the edge position and the x-mark represents that the edge position is left as the removal position as it is.

The removal decision signal 810, together with the image signal of the thinning scanning window 831, is inputted to the LUT 806 in which the target picture element is removed under the conditions that the removal decision signal in in the ON state and the connection of the pattern is maintained irrespective of removal of the target picture element. The removal decision signal is delayed by using a line memory and shift register for matching the timing, and the removal decision signals 811 to 813, together with the data of the scanning windows 832 to 834, are inputted to the LUTs 807 to 809, respectively, for makng the decisions similar to the decision in the LUT 806. These successive processes are effected with the picture element being shifted by one in synchronism with an image clock of a CCD sensor, not shown. A description will be made hereinbelow in terms of the picture element removal decision in the LUTs 806 to 809. When the removal decision signals 810 to 813 are in the ON states, the LUTs 806 to 809 decide whether the target picture elements are removed from the bit patterns in the 3×3 scanning windows 831 to 834. In the case of removing the target picture element, "0" is outputted, and in the case that the target picture element is kept, "1" is outputted. The first to nth thinning means 106a to 106n thin the pattern by one picture element from the background side with n thinning circuits each being illustrated in FIG. 16 being cascade-connected to each other so as to keep the connection of the patterns. The picture element removal decision in the thinning process is made such that the target picture element is removed in the case that the pattern is not cut irrespective of the removal of the target picture element of the 3×3 window but the connection is kept. However, for a two picture element width pattern, if depending upon only the connection decision, since the pattern is removed with one window scanning, the picture element in on thinning process is normally divided into a plurality of subcycles, and the scraping direction is limited to one subcycle so as to prevent the removal of the pattern. Such a technique is so-called parallel type thinning process and in detail described in H. Tamura, Further Considerations on Line Thinning Schemes, Paper of IECEJ, Technical Group on Pattern Recognition on Leaning, PRL 75-66 December, 1975 (in Japanese). Thus, a detailed description thereof will be omitted for brevity. In this embodiment, a one-time thinning process is divided into subcycles for scraping the pattern from the upper side, lower side, right side and left side. FIG. 19 shows patterns which are removable and which can be registered in the LUTs 806 to 809. With the removal decision signal and the 3×3 window data being used as addresses, the decision results are successively registered in order of (a) to (d) in FIG. 19. The decision result is "0" in the case of removal of the target picture element and is "1" in the case of maintaining the target picture element.

Figure 20:
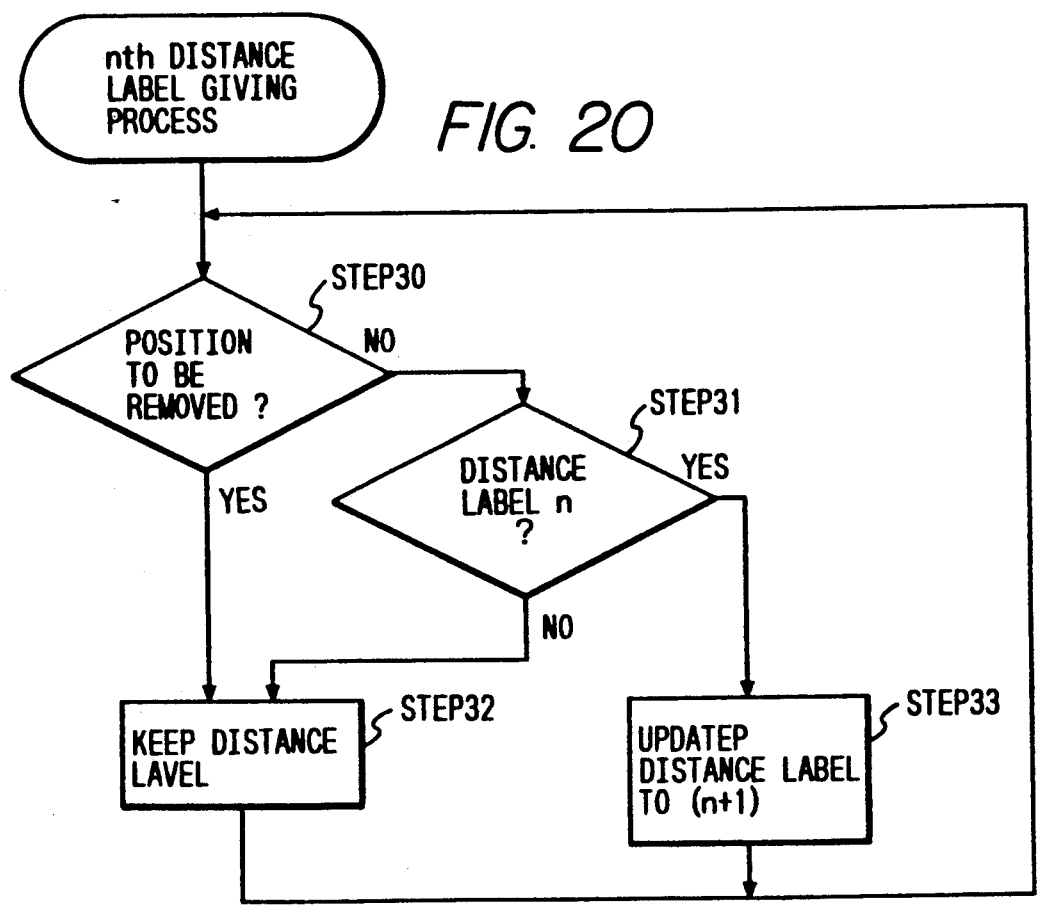
FIG. 20 is a flow chart showing a distance label giving process.
Figure 22D:
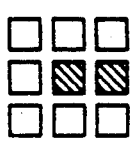
FIG. 22a-22d shows bit patterns for end-portion detection.
Figure 22C:
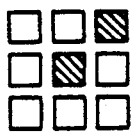
Figure 22B:
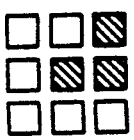
Figure 22A:
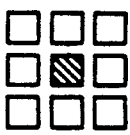

Further, a description will be made hereinbelow in terms of the processing procedure of the first to nth distance label giving means 702a to 702n. The distance label means decides the value of the distance label to be given to the target position on the basis of the thinned image signal from the terminal 821, the removal decision signal from the terminal 822 and the previous-step distance image. The decision operation in the distance label giving process will be described hereinbelow. FIG. 20 is a flow chart showing the decision operation in the nth distance label giving process. Here, the distance image to be inputted to the first distance label giving means 702a is set to the distance label "0" when the the binary-code image from the bi-level means 105 is "0" and ti the distance label "1" when the bi-level image therefrom is "1". The decision operation starts with a step 30 to check whether the target position is at the position to be removed, i.e., whether the removal decision signal is in the ON state. If the answer of the step 30 is affirmative, the operation goes to a step 32 in which the value of the distance label of the target position is kept as it is without updating the distance label. On the other hand, if the answer of the step 30 is negative, that is, if the removal decision signal is in the OFF state, a step 31 follows to check whether the distance label n is given to the target position with the first to (n−1)th distance label giving processes. If the distance label is n, a step 33 is then executed so as to update the value to (n+1). On the other hand, if the distance label is a value other than n, the operational flow goes to the step 32 to keep the value. With the above-described procedure, the inputted bi-level image is converted into the distance image having the distance labels from "1" to "(n+1)". The reason that the distance label (n+1) is given in the step 33 is that the distance label is given to the core line position in the thinning process.

Figure 21:
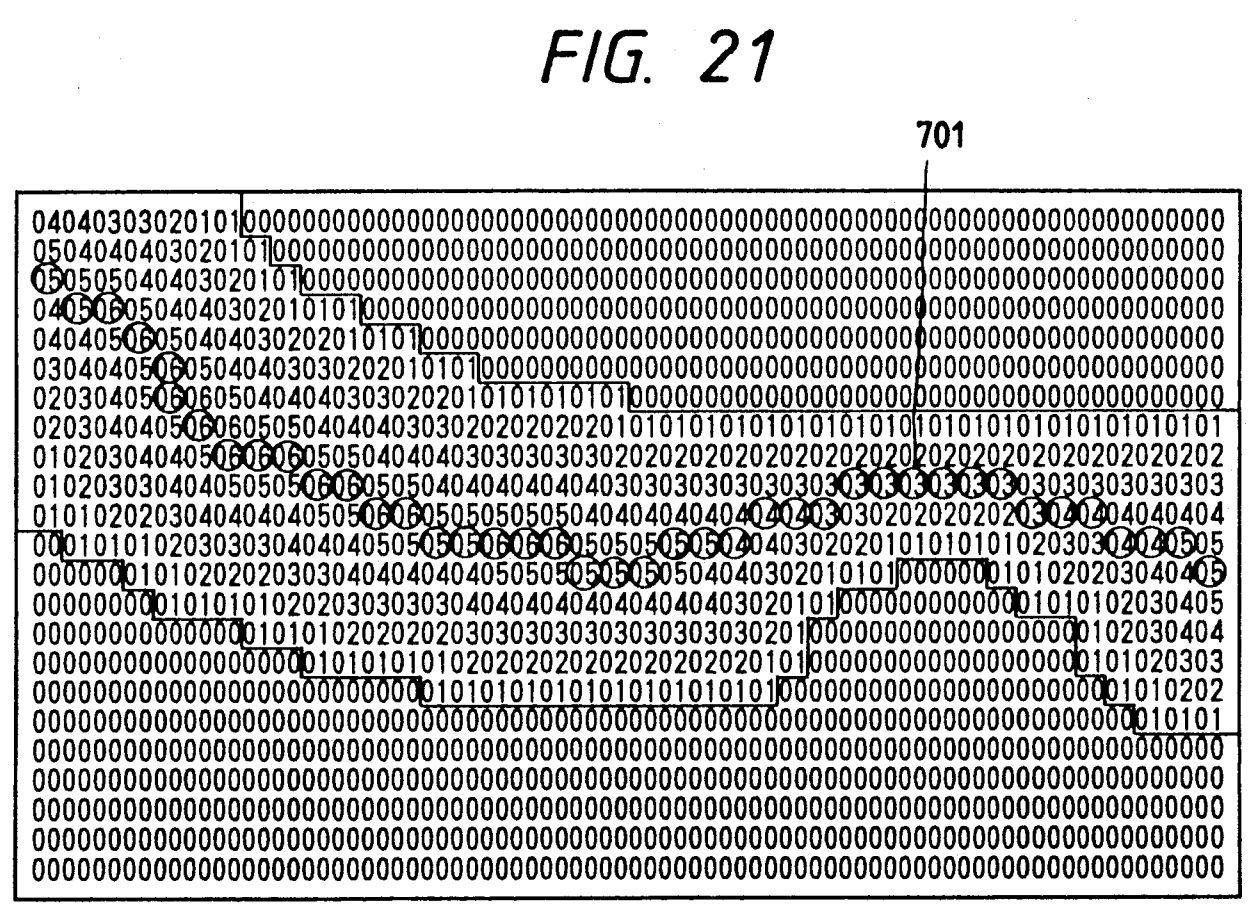

FIG. 21 is an illustration of a distance image to be obtained through the above-described process, where the positions indicated by circle marks are the core line position of the thinned image. The measurement means 704 performs the process to measure the width of the pattern along this core line position. A detailed description will be made hereinbelow with reference to FIG. 21 in terms of the detailed process to be effected by the measurement means 704. Each of the distance labels of the respective picture element of the distance image illustrated in FIG. 21 represent the distance from that position up to the nearest edge position. Thus, the sum of the distance value of the thinned core line position and the distance values of the surrounding picture elements represents the line width of the wiring pattern at that core line position. In this embodiment, the measurement value W of the line width is determined in accordance with the following equation. if the distance value of the target position is taken to be D0, the distance values of 8 picture elements surrounding the target position is taken to be Di (i=1 to 8), and the resolution of the image input is o, $$W = \left( D0 + \text{int}\left[ 1/8 \cdot \sum_{i=1}^{8} (Di) + 0.51 \right] \right) \times \rho$$

where int[*] means that the value below the decimal point of * is cut off.

For example, at the picture element position 701 in FIG. 21 the measurement value W becomes 5ρ. In the measurement means 704, the measurement value W is compared with the minimum line width Wo of the wiring pattern on the printed board which is determined in design, and the position of W<Wo is detected as the minimum line width violation. Here, as the reference value to be compared with the measurement value W, the upper limit W1 can be set whereby the position violated from W0≦W<W1 is detected as the line width violation. Moreover, it is also appropriate that second line width lower limit W2 and upper limit W3 (W2>W1) are set so that the position violated from W2≦W<W3 is also detected as the line width violation, thereby allowing the inspection of plural kinds of line widths. Now, when the minimum line width W0 is set to be 6ρ, the picture element position 701 in FIG. 21 is detectable to be a line width violation position.

Further, the process to be effected by the end-point detecting means 705 will hereinbelow be described in detail with reference to FIG. 22. FIG. 22 shows detection patterns for detection of an end point of the core line formed in the thinning process, where the illustrations of the rotation symmetry and mirror symmetry are omitted. The end point decision will be made in accordance with the following procedure. That is, the thinned image from the nth thinning means 106n is scanned with a 3×3 window and, when the bit pattern is coincident with one of the patterns indicated by (a) to (d) in FIG. 22, it is determined as a disconnection nomination. These processes can be performed with an arrangement similar to the arrangement for the window scanning process and LUT process described with reference to FIG. 16. Now, in the case that the target position is the disconnection nomination position, the measurement value of the line width at that position is compared with a terminal width of the printed wiring pattern. Assuming that the minimum value of the terminal width is Wt, when the measurement value W due to the measurement means 704 is smaller than Wt, it is determined to be a disconnection position.

Still further, the process to be effected by the branch detecting means 706 will hereinbelow be described in detail with reference to FIG. 23. FIG. 23 shows detection patterns for detection of a branch point of the core line formed in the thinning process, where the illustration of the rotation symmetry and mirror symmetry is omitted. As well as the process of the end-point detecting means 705, the branch detecting process is first effected such that the thinned image from the nth thinning means 106n is scanned with a 3×3 window, and when the bit pattern is coincident with one of the patterns indicated by (a) to (m) in FIG. 23, it is detected as the branch position. The branch of the core line of the wiring pattern shows the short feature to be detected as the defect position.

According to the fifth embodiment of this invention, the removal nomination picture element is detected with respect to the bi-level image of a printed board so as to switch the picture element to be removed in each of the respective thinning processes between the four-adjacent edge and eight-adjacent edge at every repeat of the thinning to give the distance label simultaneously with the thinning. This arrangement can obtain an octagonal distance image, thereby allowing accurate inspection of the line width of the wiring pattern in horizontal, vertical and oblique directions with a simple structure. Further, the position of the removal nomination picture element is changed from the four or eight adjacent edge position at the time of a specified repeat of the thinning, thereby obtaining the distance image accurately reflecting the distance from the edge of the wiring pattern to allow accurate measurement in the omnidirection of the wiring pattern. Still further, since in the defect detecting means 703 the line width measurement value based on the distance value of the core line of the thinned image can directly be compared with a given line width threshold, it is possible to easily perform the line width inspection. Moreover, if in the defect detecting means 703 a plurality of line width thresholds to be compared with the line width measurement value at the core line position are set, it is possible to accurately perform the inspection irrespective of presence of plural kinds of line widths on the printed board. In addition, since in the defect detecting means 703 the end-portion and branch of the core line are detected, it is possible to recognize the defects such as disconnection and short concurrently with the line width inspection.

It should be understood that the foregoing relates to only preferred embodiments of the invention, and that it is intended to cover all changes and modifications of the embodiments of the invention herein used for the purposes of the disclosure, which do not constitute departures from the spirit and scope of the invention.

What is claimed is:

1. A wiring pattern inspection apparatus comprising:

image inputting means for optically retrieving an image of a wiring pattern on a printed circuit board and photoelectrically converting the retrieved wiring pattern image into a grey level image;

bi-level means coupled to said image inputting means for comparing said grey level image with a predetermined threshold to convert said grey level image into a bi-level image;

first to nth thinning means cascade-connected to each other with said first thinning means coupled to said bi-level means to receive said bi-level image of said wiring pattern therefrom, each of said first to nth thinning means respectively thinning said wiring pattern by one pixel from the background so that said wiring pattern is thinned by n pixels so as to be converted into a skeleton image with associated connectivity;

first to nth removal position decision means respectively associated with said first to nth thinning means for receiving the bi-level image so as to detect either a 4-adjacent or 8-adjacent edge image of said wiring pattern;

first to nth distance label giving means cascade-connected to each other to perform distance label processes to successively change distance labels from the outside layer to the inside layer of said wiring pattern with respect to a distance image where, in terms of said bi-level image from said bi-level means, the distance label of the background is "0" and the distance label of said wiring pattern is "1", so that said wiring pattern has "1" to "(n+1)" distance labels, each of said first to nth distance label giving means increments by one the distance label with respect to non-edge pixels of the edge image from each of said first to nth removal position decision means so that said nth distance label giving means outputs a final distance image where all pixels of said wiring pattern from the back ground to distance (n+1) have distance labels;

measurement means coupled to said nth thinning means and said nth distance label giving means for adding the distance label of a target pixel on a core line to an average value of the distance labels of 8 pixels surrounding said target pixel with reference to said bi-level image from said nth thinning means and said distance image from said nth distance label giving means to obtain a line width to be compared with a predetermined threshold line width;

end-portion detecting means coupled to said nth thinning means and said measurement means to detect an end point of said core line with reference to said bi-level image from said nth thinning means so as to detect an open-end when the line width which is obtained by said measurement means and which corresponds in position to said end portion is smaller than a predetermined minimum value; and branch detecting means for detecting a branched position of said core lie with reference to said bi-level image from said nth thinning means.

2. A wiring pattern inspection apparatus as claimed in claim 1, wherein each of said first to nth removal position decision means includes edge detecting means and removal position correction means, said removal position correction means scans the bi-level image and the edge image thereof with a dimensioned window to check the matching of said images with a predetermined template pattern so that a target position is changed from "1" to "0" to be a non-removed position when the edge image is 4-adjacent edged and changed from "0" to "1" to become a removed position when the edge image is 8-adjacent edged, whereby said wiring pattern is equally thinned from the background.

* * * * *